United States Patent
De Cian

(10) Patent No.: US 11,880,588 B2
(45) Date of Patent: Jan. 23, 2024

(54) SSD DEVICE FEATURING IMPROVED DECODING

(71) Applicant: Gylicon LTD, London (GB)

(72) Inventor: Valentina De Cian, Sedico (IT)

(73) Assignee: Gylicon LTD., London (GB)

( * ) Notice: Subject to any disclaimer, the term of this patent is extended or adjusted under 35 U.S.C. 154(b) by 57 days.

(21) Appl. No.: 17/663,281

(22) Filed: May 13, 2022

(65) Prior Publication Data

US 2023/0367505 A1 Nov. 16, 2023

(51) Int. Cl.
*G06F 12/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
See application file for complete search history.

(56) References Cited

U.S. PATENT DOCUMENTS

| | | | |
|---|---|---|---|
| 2020/0136653 A1* | 4/2020 | Kim | H03M 13/1171 |
| 2021/0143838 A1* | 5/2021 | Marchand | H03M 13/1575 |

* cited by examiner

Primary Examiner — Arvind Talukdar

(74) *Attorney, Agent, or Firm* — Janeway Patent Law PLLC; John M. Janeway

(57) ABSTRACT

A method for decoding, in a solid-state storage device, a read symbol encoded with a Q-ary LDPC code defined over a binary-extension Galois field $GF(2^r)$, wherein the read symbol is associated with $2^r$ LLR values each one denoting a symbol probability indicative that the read symbol was equal to a respective possible symbol, the method comprising:
(a) associating, with the read symbol, candidate symbols comprising a number of the possible symbols associated with LLR values indicative of highest symbol probabilities;
(b) storing the candidate symbols and the associated LLR values in V2C and V_SUM matrices;
(c) based on the V2C matrix, performing a check node update procedure to update the C2V matrix;
(d1) determining an updating LLR value for each possible symbol associated with the read symbol;
(d2) determining, for the V_SUM matrix, an approximated LLR value for each excluded symbol, said determining being based on the LLR value indicative of the lowest symbol probability, and on an offset LLR value;
(d3) updating the LLR values and the approximated LLR values of the V_SUM matrix with the respective LLR updating values;
(d4) performing step (a) based on the updated LLR values;
(d5) performing steps (d2) to (d4) for the V2C matrix;
(d6) performing step (b) for both V2C and V_SUM matrices based on the respective candidate symbols and the associated updated LLR values, thereby obtaining updated V2C and V_SUM matrices;
(e) determining an outcome of the decoding attempt provided by the updated V_SUM matrix.

16 Claims, 8 Drawing Sheets

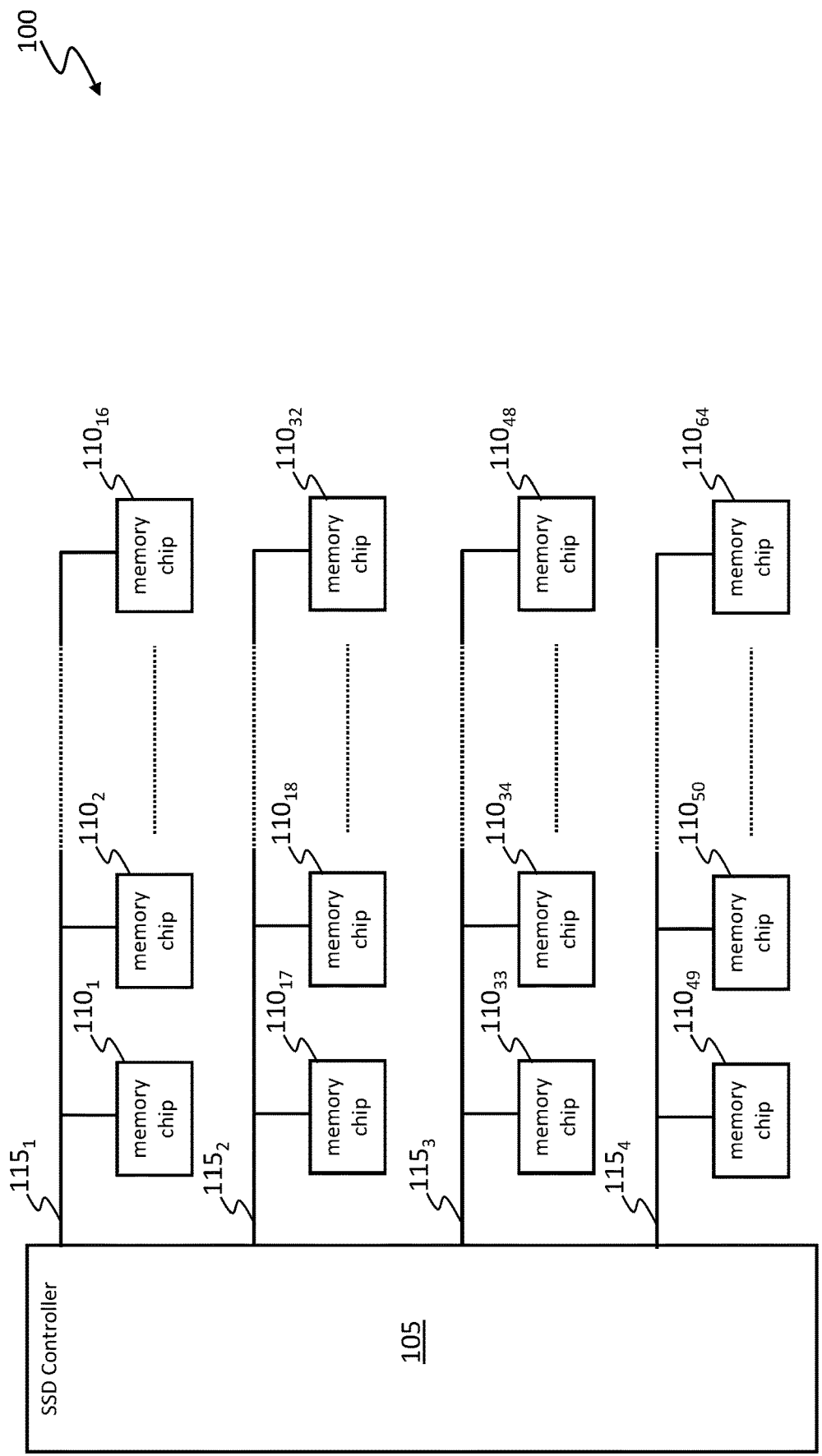

Figure 2A:
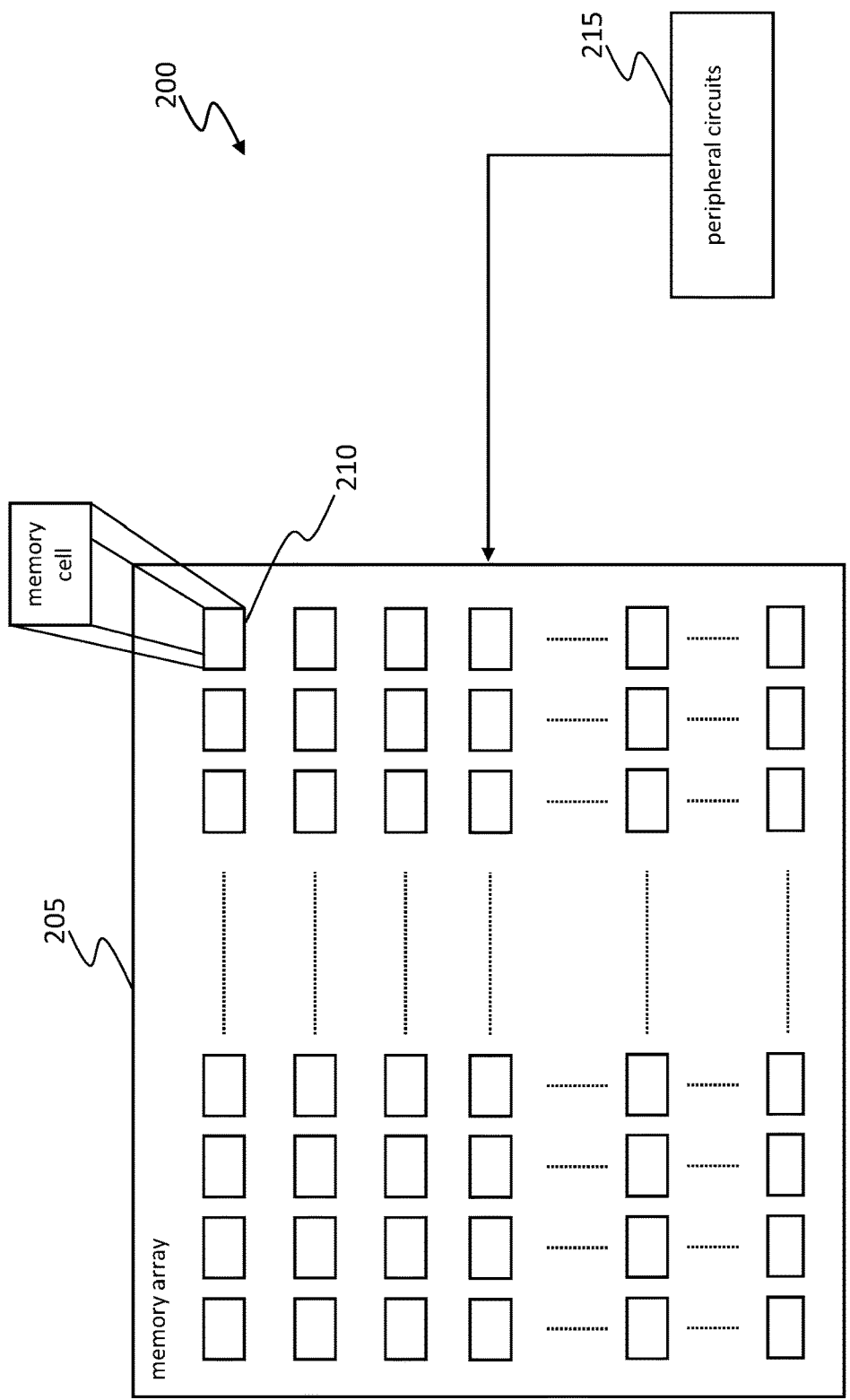

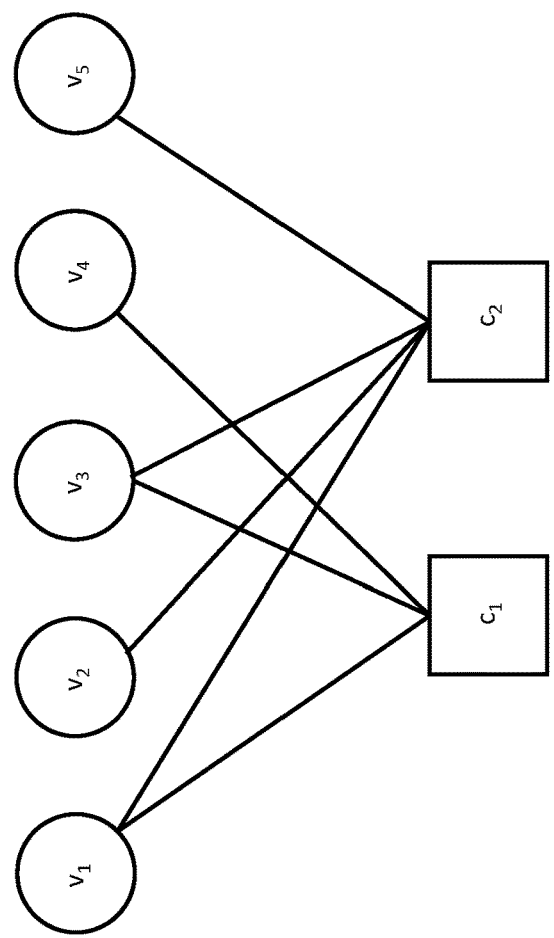
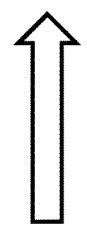
$$H = \begin{pmatrix} 1 & 0 & 1 & 1 & 0 \\ 1 & 1 & 1 & 0 & 1 \end{pmatrix}$$
Figure 3B

SSD DEVICE FEATURING IMPROVED DECODING

BACKGROUND ART

Technical Field

The present disclosure generally relates to solid state storage devices, also known as "Solid State Drives" (hereinafter, SSD devices), such as SSD devices provided with non-volatile memory chips (e.g., NAND flash memory chips) for storing data. More particularly, the present disclosure relates to SSD devices provided with error correction capabilities. Even more particularly, the present disclosure relates to a SSD device implementing (e.g., in a controller thereof) a method for decoding bits encoded with a non-binary LDPC code.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

A common type of memory cell comprises a floating gate transistor: each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one bit pattern comprising one bit (i.e. two logical states, 0 or 1, defining two threshold voltages), in "Multi-Level Cell" (MLC) technology each memory cell (or MLC memory cell) is capable of storing one bit pattern comprising more than one bit, typically two bits (i.e. four logical states, 00, 01, 10, or 11, defining four threshold voltages), whereas in "Tri-Level Cell" technology each memory cell (or TLC memory cell) is capable of storing one bit pattern comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same bit patterns), practically each threshold voltage associated with a corresponding logical state (or, equivalently, with a corresponding bit pattern) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a SLC memory cell, in FIG. 2C for a 2-bit MLC memory cell (hereinafter referred to as MLC memory cell for the sake of conciseness), and in the top drawing of FIG. 2D for a TCL memory cell. In such figures the threshold voltage distributions are denoted by $D_j$ (j ranging from 1 to 2 for the SLC memory cell, from 1 to 4 for the MLC memory cell, and from 1 to 8 for the TLC memory cell).

Figure 2B:
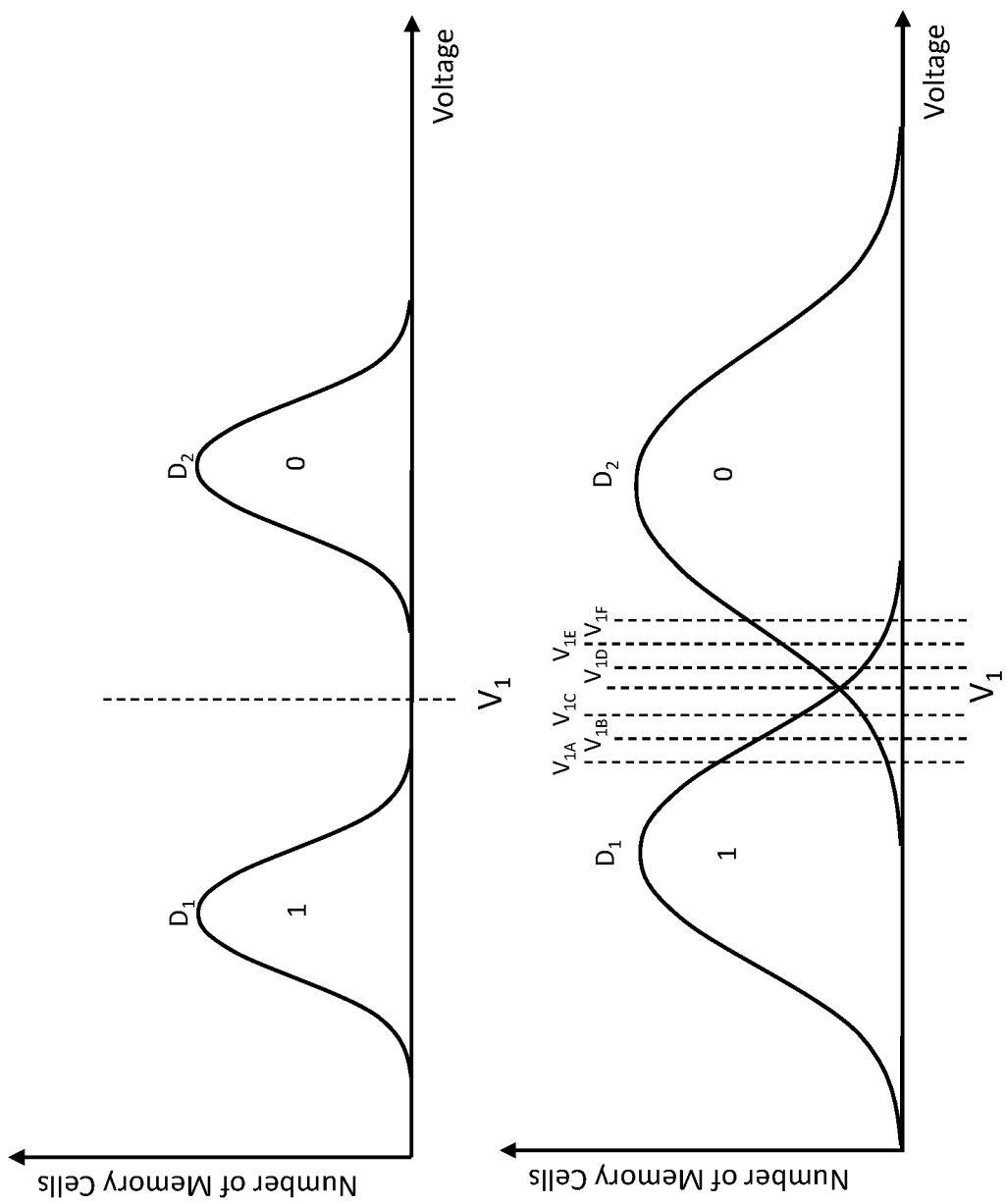
Figure 2C:
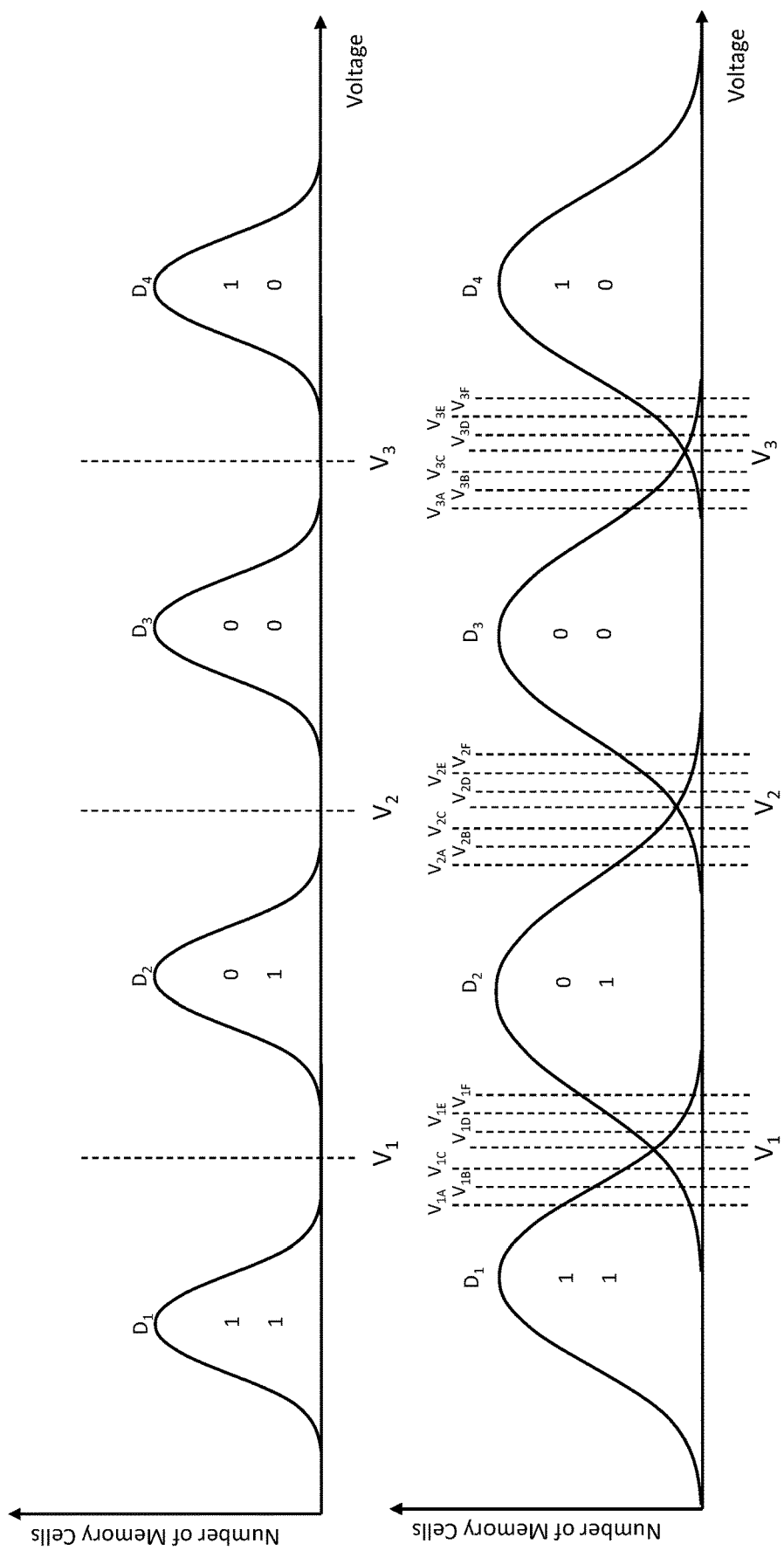
Figure 2D:
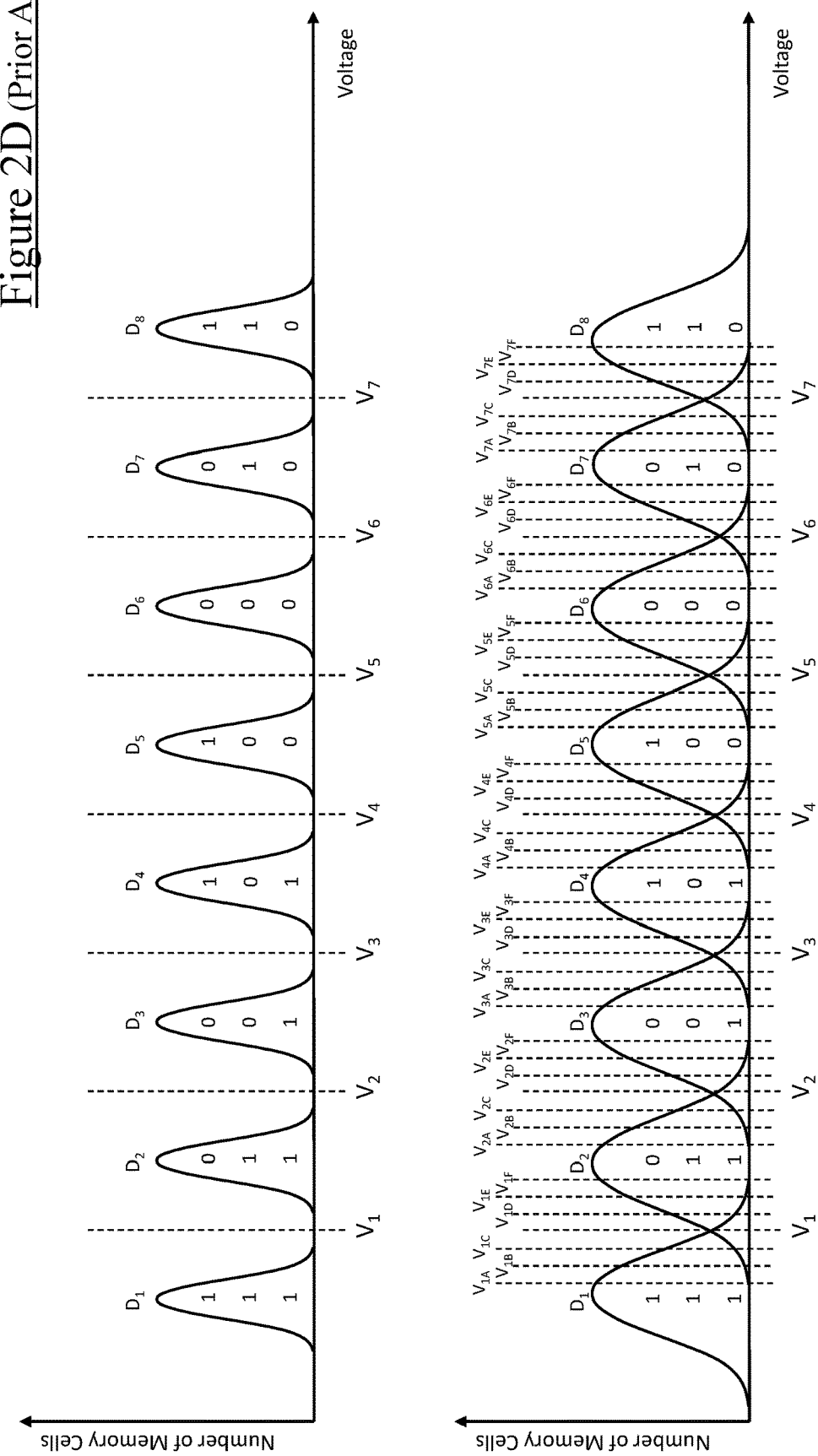

The threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1 in the example of FIG. 2B, k=1,2,3 in the example of FIG. 2C and k=1,2,3,4,5,6,7 in the example of FIG. 2D).

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in the bottom drawings of FIGS. 2B, 2C and 2D) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the (information) bits to be stored are encoded in a redundant way (e.g., by adding parity bits) by means of an "Error Correction Code" (ECC code), thus obtaining a corresponding codeword, so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions Pi, and particularly according to the overlapping areas of the adjacent threshold voltage distributions D.

As a result of the advances in memory cell technology, the RBER for selected memory cells is increasing. The RBER observed after application of the ECC code is referred to as "Frame Bit Error Rate" (FER), whereas the FER divided by the number of read bits is referred to as "Uncorrectable Bit Error Rate" (UBER).

To achieve an acceptable UBER, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER—the decoding based on the hard and soft bits being referred to as hard and soft decoding, respectively.

LDPC codes are defined using sparse parity-check matrices comprising of a small number of non-zero entries. LDPC codes are well represented by bipartite graphs, often called Tanner graphs, in which one set of nodes, referred to as variable nodes, corresponds to bits of the codeword and the other set of nodes, referred to as check nodes, correspond to the set of parity-check constraints which define the code. Edges in the graph connect variable nodes to check nodes. A check node is connected to a variable node when the corresponding element of the parity check matrix is 1. The number of columns of the parity check matrix corresponds to the number of codeword bits within one encoded codeword. The number of rows within the parity check matrix corresponds to the number of parity check bits in the codeword.

Decoders and decoding algorithms used to decode LDPC codewords operate by exchanging messages within the graph along the edges and updating these messages by performing computations at the nodes based on the incoming messages (usually referred to as check node update and variable node update). Such algorithms are generally referred to as message passing algorithms.

Binary LDPC codes and non-binary LDPC codes are known.

Non-binary LDPC codes are known to outperform binary codes of comparative length over many types of channels. However, the high decoding complexity of non-binary LDPC codes has so far restricted their practical usage.

SUMMARY

The Applicant has recognized that non-binary LDPC codes do not lend themselves to be applied in SSD devices.

Indeed, the Applicant has recognized that the design of high-throughput decoders for non-binary LDPC codes, with moderate silicon area and high speed, is a challenging problem, especially for large finite fields.

Indeed, conventional message passing algorithm performs message-passing on the Tanner graph based on flooding scheduling: messages from all variable nodes to the linked check nodes are updated and propagated simultaneously, so are the messages from all check nodes to the linked variable nodes. However, such a fully-parallel decoding schedule often requires many iterations to converge and necessitates complicated interconnections and large memory for hardware implementation and decoding matrices storing.

The Applicant has tackled the above-discussed issues, and has devised a SSD device implementing an improved decoding of non-binary LDPC codes.

One or more aspects of the present disclosure are set out in the independent claims, with advantageous features of the same disclosure that are indicated in the dependent claims, whose wording is enclosed herein verbatim by reference (with any advantageous feature being provided with reference to a specific aspect of the present disclosure that applies mutatis mutandis to any other aspect thereof).

An aspect of the present disclosure relates to a method for decoding, in a solid-state storage device, a read symbol encoded with a Q-ary LDPC code defined over a binary-extension Galois field $GF(2^r)$ and identified by a parity-check matrix associated with check nodes and variable nodes of a Tanner graph representing the parity-check matrix.

According to an embodiment of the method, the read symbol is associated with $2^r$ LLR values each one denoting a symbol probability indicative that the read symbol was equal to a respective one among $2^r$ possible symbols before being corrupted by channel noise effects.

According to an embodiment of the method, said decoding is based on a processing of a first matrix and a second matrix indicative of messages from check nodes to variable nodes and from variable nodes to check nodes, respectively, exchanged by means of a message passing computation rule, and of a third matrix providing a decoding attempt for the read symbol.

According to an embodiment of the method, the method may comprise associating, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols (step (a)).

According to an embodiment of the method, the method may comprise storing said plurality of candidate symbols and the LLR values associated therewith in the second matrix and in the third matrix, the excluded symbols being excluded from storing (step (b)).

According to an embodiment, the method may comprise, based on said second matrix, performing a check node update procedure to update the first matrix (step (c)).

According to an embodiment of the method, the method may comprise performing a variable node update procedure (step (d)).

According to an embodiment of the method, the variable node update procedure may comprise determining an updating LLR value for each of the possible symbols associated with the read symbol, wherein said determining is based on the first, second and third matrices (step (d1)).

According to an embodiment of the method, the variable node update procedure may comprise determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol (step (d2)).

According to an embodiment of the method, the variable node update procedure may comprise updating the LLR values and the approximated LLR values of the third matrix with the respective LLR updating values, thereby obtaining respective updated LLR values (step (d3)).

According to an embodiment of the method, the variable node update procedure may comprise performing step (a) based on the updated LLR values (step (d4)).

According to an embodiment of the method, the variable node update procedure may comprise performing steps (d2), (d3) and (d4) for the second matrix (step (d5)).

According to an embodiment of the method, the variable node update procedure may comprise performing step (b) for both the second matrix and the third matrix based on the respective plurality of candidate symbols and the updated LLR values associated therewith, thereby obtaining an updated second matrix and an updated third matrix (step (d6)).

According to an embodiment of the method, the method may comprise determining an outcome of the decoding attempt provided by the updated third matrix (step (e)).

According to an embodiment of the method, the method may comprise iterating steps (c) to (e) in case of a negative outcome of the decoding attempt.

According to an embodiment of the method, at each current iteration, said updating LLR value is indicative of a LLR value difference arising from check node update procedure performed at the current iteration, and the variable node update procedure performed at a previous iteration preceding the current iteration.

According to an embodiment of the method, said determining an updating LLR value for each of the possible symbols associated with the read symbol is based, for each possible symbol, and for each of the first, second and third matrices, on the corresponding LLR value associated with the possible symbol if the respective possible symbol is a candidate symbol for the read symbol, or on a corresponding estimate of the LLR value associated with the possible symbol if the possible symbol is a respective excluded symbol for the read symbol.

According to an embodiment of the method, said estimate of the LLR value is based, for the read symbol, on the LLR value, among the respective LLR values associated with the plurality of candidate symbols, indicative of the lowest symbol probability, and on a respective correction factor.

According to an embodiment of the method, the correction factor comprises a positive constant depending on the distance relationship between the read symbol and the excluded symbol.

According to an embodiment of the method, the correction factor comprises said offset LLR value.

According to an embodiment of the method, for each excluded symbol, the respective offset LLR value depends on a difference between the distance relationship between the read symbol and the excluded symbol and the distance relationship between the read symbol and the candidate symbol associated with the LLR value, among the LLR values associated with the plurality of candidate symbols associated with the read symbol, indicative of the lowest symbol probability.

According to an embodiment of the method, said plurality of candidate symbols associated with the read symbol comprise a predetermined number of the possible symbols that are the closest, in terms of said distance relationship, to the read symbol.

According to an embodiment of the method, the distance relationship depends on channel model.

According to an embodiment of the method, the channel model is an "Additive White Gaussian Noise" (AWGN) channel model.

According to an embodiment of the method, the distance relationship is a binary distance.

According to an embodiment of the method, said determining an outcome of the decoding attempt is based on syndrome calculation.

According to an embodiment of the method, said iterating steps (c) to (e) is performed until a maximum number of decoding iterations is reached.

According to an embodiment of the method, the message passing computation rule comprises a "Belief Propagation" (BP) algorithm, a "Min-Sum" algorithm or an "Extended Min-Sum" algorithm.

Another aspect of the present disclosure relates to a controller for a solid-state storage device.

According to an embodiment of the controller, the controller is configured to decode a read symbol encoded with a Q-ary LDPC code defined over a binary-extension Galois field GF($2^r$) and identified by a parity-check matrix associated with check nodes and variable nodes of a Tanner graph representing the parity-check matrix.

According to an embodiment of the controller, the read symbol is associated with $2^r$ LLR values each one denoting a symbol probability indicative that the read symbol was equal to a respective one among $2^r$ possible symbols before being corrupted by channel noise effects.

According to an embodiment of the controller, the controller is configured to decode the read symbol based on a processing of a first matrix and a second matrix indicative of messages from check nodes to variable nodes and from variable nodes to check nodes, respectively, exchanged by means of a message passing computation rule, and of a third matrix providing a decoding attempt for the read symbol.

According to an embodiment of the controller, the controller is configured to associate, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols (step (a)).

According to an embodiment of the controller, the controller is configured to store said plurality of candidate symbols and the LLR values associated therewith in the second matrix and in the third matrix, the excluded symbols being excluded from storing (step (b)).

According to an embodiment of the controller, the controller is configured to, based on said second matrix, perform a check node update procedure to update the first matrix (step (c)).

According to an embodiment of the controller, the controller is configured to perform a variable node update procedure (step (d)).

According to an embodiment of the controller, the controller is configured to perform the variable node update procedure by determining an updating LLR value for each of the possible symbols associated with the read symbol, wherein said determining is based on the first, second and third matrices (step (d1)).

According to an embodiment of the controller, the controller is configured to perform the variable node update procedure by determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol (step (d2)).

According to an embodiment of the controller, the controller is configured to perform the variable node update procedure by updating the LLR values and the approximated LLR values of the third matrix with the respective LLR updating values, thereby obtaining respective updated LLR values (step (d3)).

According to an embodiment of the controller, the controller is configured to perform the variable node update procedure by performing step (a) based on the updated LLR values (step (d4)).

According to an embodiment of the controller, the controller is configured to perform the variable node update procedure by performing steps (d2), (d3) and (d4) for the second matrix (step (d5)).

According to an embodiment of the controller, the controller is configured to perform the variable node update procedure by performing step (b) for both the second matrix and the third matrix based on the respective plurality of candidate symbols and the updated LLR values associated therewith, thereby obtaining an updated second matrix and an updated third matrix (step (d6)).

According to an embodiment of the controller, the controller is configured to determine an outcome of the decoding attempt provided by the updated third matrix (step (e)).

According to an embodiment of the controller, the controller is configured to iterate steps (c) to (e) in case of a negative outcome of the decoding attempt.

According to an embodiment of the controller, at each current iteration, said updating LLR value is indicative of a LLR value difference arising from check node update procedure performed at the current iteration, and the variable node update procedure performed at a previous iteration preceding the current iteration.

According to an embodiment of the controller, the controller is configured to determine the updating LLR value for each of the possible symbols associated with the read symbol based on, for each possible symbol, and for each of the first, second and third matrices, the corresponding LLR value associated with the possible symbol if the respective possible symbol is a candidate symbol for the read symbol, or based on a corresponding estimate of the LLR value associated with the possible symbol if the possible symbol is a respective excluded symbol for the read symbol.

According to an embodiment of the controller, said estimate of the LLR value is based, for the read symbol, on the LLR value, among the respective LLR values associated with the plurality of candidate symbols, indicative of the lowest symbol probability, and on a respective correction factor.

According to an embodiment of the controller, the correction factor comprises a positive constant depending on the distance relationship between the read symbol and the excluded symbol.

According to an embodiment of the controller, the correction factor comprises said offset LLR value.

According to an embodiment of the controller, for each excluded symbol, the respective offset LLR value depends on a difference between the distance relationship between the read symbol and the excluded symbol and the distance relationship between the read symbol and the candidate symbol associated with the LLR value, among the LLR values associated with the plurality of candidate symbols associated with the read symbol, indicative of the lowest symbol probability.

According to an embodiment of the controller, said plurality of candidate symbols associated with the read symbol comprise a predetermined number of the possible symbols that are the closest, in terms of said distance relationship, to the read symbol.

According to an embodiment of the controller, the distance relationship depends on channel model.

According to an embodiment of the controller, the channel model is an "Additive White Gaussian Noise" (AWGN) channel model.

According to an embodiment of the controller, the distance relationship is a binary distance.

According to an embodiment of the controller, said determining an outcome of the decoding attempt is based on syndrome calculation.

According to an embodiment of the controller, the controller is configured to iterate steps (c) to (e) until a maximum number of decoding iterations is reached.

According to an embodiment of the controller, the message passing computation rule comprises a "Belief Propagation" (BP) algorithm, a "Min-Sum" algorithm or an "Extended Min-Sum" algorithm.

A further aspect of the present disclosure relates to a solid state storage device (SSD device) (such as a flash memory device) including memory cells (such as flash memory cells).

According to an embodiment of the SSD device, the controller is configured to decode a read symbol encoded with a Q-ary LDPC code defined over a binary-extension Galois field $GF(2^r)$ and identified by a parity-check matrix associated with check nodes and variable nodes of a Tanner graph representing the parity-check matrix.

According to an embodiment of the SSD device, the read symbol is associated with $2^r$ LLR values each one denoting a symbol probability indicative that the read symbol was equal to a respective one among $2^r$ possible symbols before being corrupted by channel noise effects.

According to an embodiment of the SSD device, the controller is configured to decode the read symbol based on a processing of a first matrix and a second matrix indicative of messages from check nodes to variable nodes and from variable nodes to check nodes, respectively, exchanged by means of a message passing computation rule, and of a third matrix providing a decoding attempt for the read symbol.

According to an embodiment of the SSD device, the controller is configured to associate, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols (step (a)).

According to an embodiment of the SSD device, the controller is configured to store said plurality of candidate symbols and the LLR values associated therewith in the second matrix and in the third matrix, the excluded symbols being excluded from storing (step (b)).

According to an embodiment of the SSD device, the controller is configured to, based on said second matrix, perform a check node update procedure to update the first matrix (step (c)).

According to an embodiment of the SSD device, the controller is configured to perform a variable node update procedure (step (d)).

According to an embodiment of the SSD device, the controller is configured to perform the variable node update procedure by determining an updating LLR value for each of the possible symbols associated with the read symbol, wherein said determining is based on the first, second and third matrices (step (d1)).

According to an embodiment of the SSD device, the controller is configured to perform the variable node update procedure by determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol (step (d2)).

According to an embodiment of the SSD device, the controller is configured to perform the variable node update procedure by updating the LLR values and the approximated LLR values of the third matrix with the respective LLR updating values, thereby obtaining respective updated LLR values (step (d3)).

According to an embodiment of the SSD device, the controller is configured to perform the variable node update procedure by performing step (a) based on the updated LLR values (step (d4)).

According to an embodiment of the SSD device, the controller is configured to perform the variable node update procedure by performing steps (d2), (d3) and (d4) for the second matrix (step (d5)).

According to an embodiment of the SSD device, the controller is configured to perform the variable node update procedure by performing step (b) for both the second matrix and the third matrix based on the respective plurality of candidate symbols and the updated LLR values associated therewith, thereby obtaining an updated second matrix and an updated third matrix (step (d6)).

According to an embodiment of the SSD device, the controller is configured to determine an outcome of the decoding attempt provided by the updated third matrix (step (e)).

According to an embodiment of the SSD device, the controller is configured to iterate steps (c) to (e) in case of a negative outcome of the decoding attempt.

According to an embodiment of the SSD device, at each current iteration, said updating LLR value is indicative of a LLR value difference arising from check node update procedure performed at the current iteration, and the variable node update procedure performed at a previous iteration preceding the current iteration.

According to an embodiment of the SSD device, the controller is configured to determine the updating LLR value for each of the possible symbols associated with the read symbol based on, for each possible symbol, and for each of the first, second and third matrices, the corresponding LLR value associated with the possible symbol if the respective possible symbol is a candidate symbol for the read symbol, or based on a corresponding estimate of the LLR value associated with the possible symbol if the possible symbol is a respective excluded symbol for the read symbol.

According to an embodiment of the SSD device, said estimate of the LLR value is based, for the read symbol, on the LLR value, among the respective LLR values associated with the plurality of candidate symbols, indicative of the lowest symbol probability, and on a respective correction factor.

According to an embodiment of the SSD device, the correction factor comprises a positive constant depending on the distance relationship between the read symbol and the excluded symbol.

According to an embodiment of the SSD device, the correction factor comprises said offset LLR value.

According to an embodiment of the SSD device, for each excluded symbol, the respective offset LLR value depends on a difference between the distance relationship between the read symbol and the excluded symbol and the distance relationship between the read symbol and the candidate symbol associated with the LLR value, among the LLR values associated with the plurality of candidate symbols associated with the read symbol, indicative of the lowest symbol probability.

According to an embodiment of the SSD device, said plurality of candidate symbols associated with the read symbol comprise a predetermined number of the possible symbols that are the closest, in terms of said distance relationship, to the read symbol.

According to an embodiment of the SSD device, the distance relationship depends on channel model.

According to an embodiment of the SSD device, the channel model is an "Additive White Gaussian Noise" (AWGN) channel model.

According to an embodiment of the SSD device, the distance relationship is a binary distance.

According to an embodiment of the SSD device, said determining an outcome of the decoding attempt is based on syndrome calculation.

According to an embodiment of the SSD device, the controller is configured to iterate steps (c) to (e) until a maximum number of decoding iterations is reached.

According to an embodiment of the SSD device, the message passing computation rule comprises a "Belief Propagation" (BP) algorithm, a "Min-Sum" algorithm or an "Extended Min-Sum" algorithm.

BRIEF DESCRIPTION OF THE ANNEXED DRAWINGS

Figure 3A:
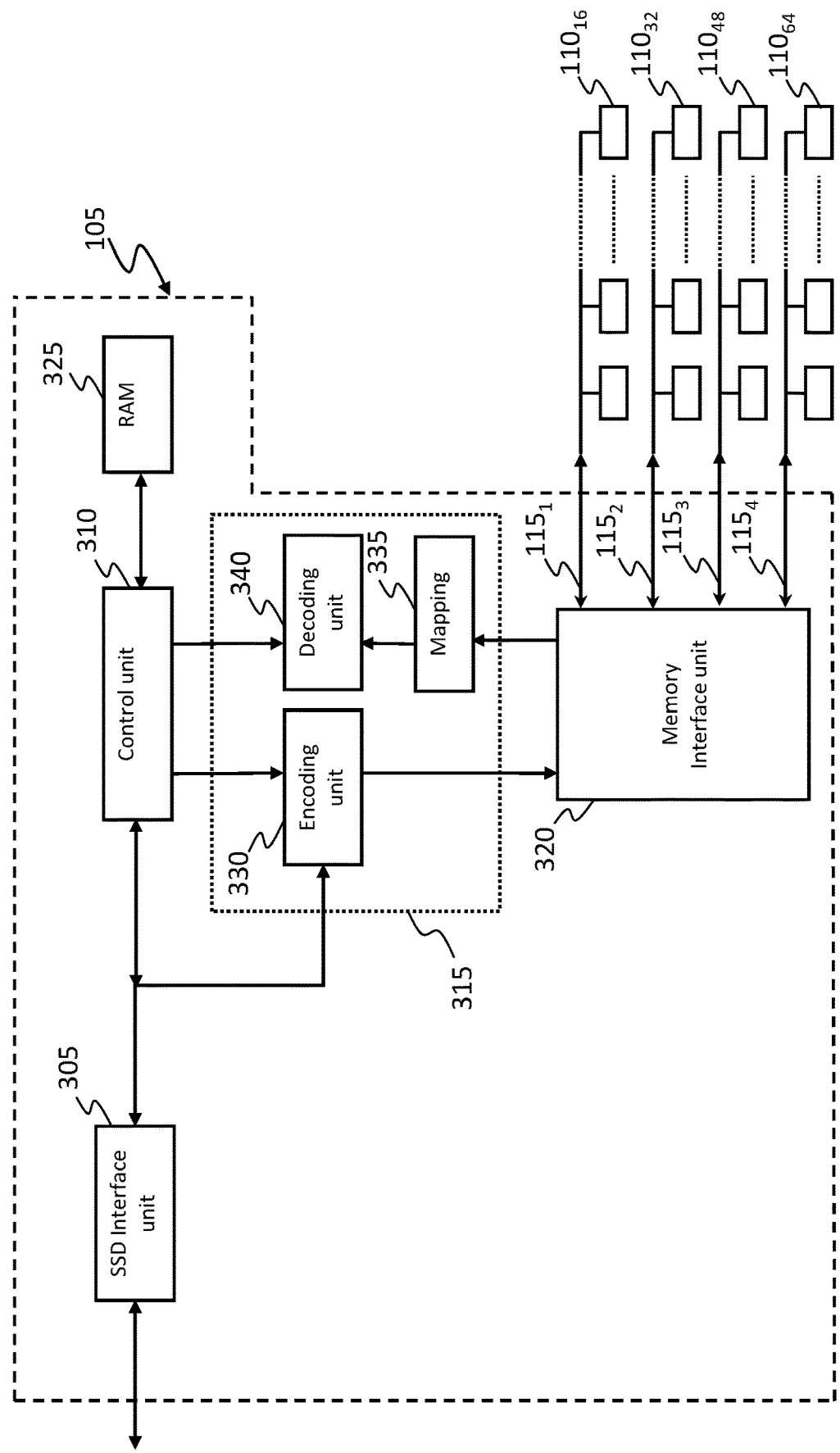

These and other features and advantages of the present disclosure will be made apparent by the following description of some exemplary and non-limitative embodiments thereof. For its better intelligibility, the following description should be read making reference to the attached drawings, wherein:

FIG. 1 schematically shows a simplified architecture of an SSD device according to embodiments of the present disclosure;

FIG. 2A schematically shows an exemplary architecture of a flash memory die of said SSD device according to embodiments of the present disclosure;

FIGS. 2B, 2C and 2D schematically show exemplary ideal (top drawing) and real (bottom drawing) threshold voltage distributions of SLC memory cells, of MLC memory cells and of TLC memory cells, respectively, of said flash memory die;

FIG. 3A schematically shows a simplified architecture of an SSD controller of the SSD device according to embodiments of the present disclosure;

FIG. 3B schematically shows an exemplary binary Tanner graph, and

Figure 4:
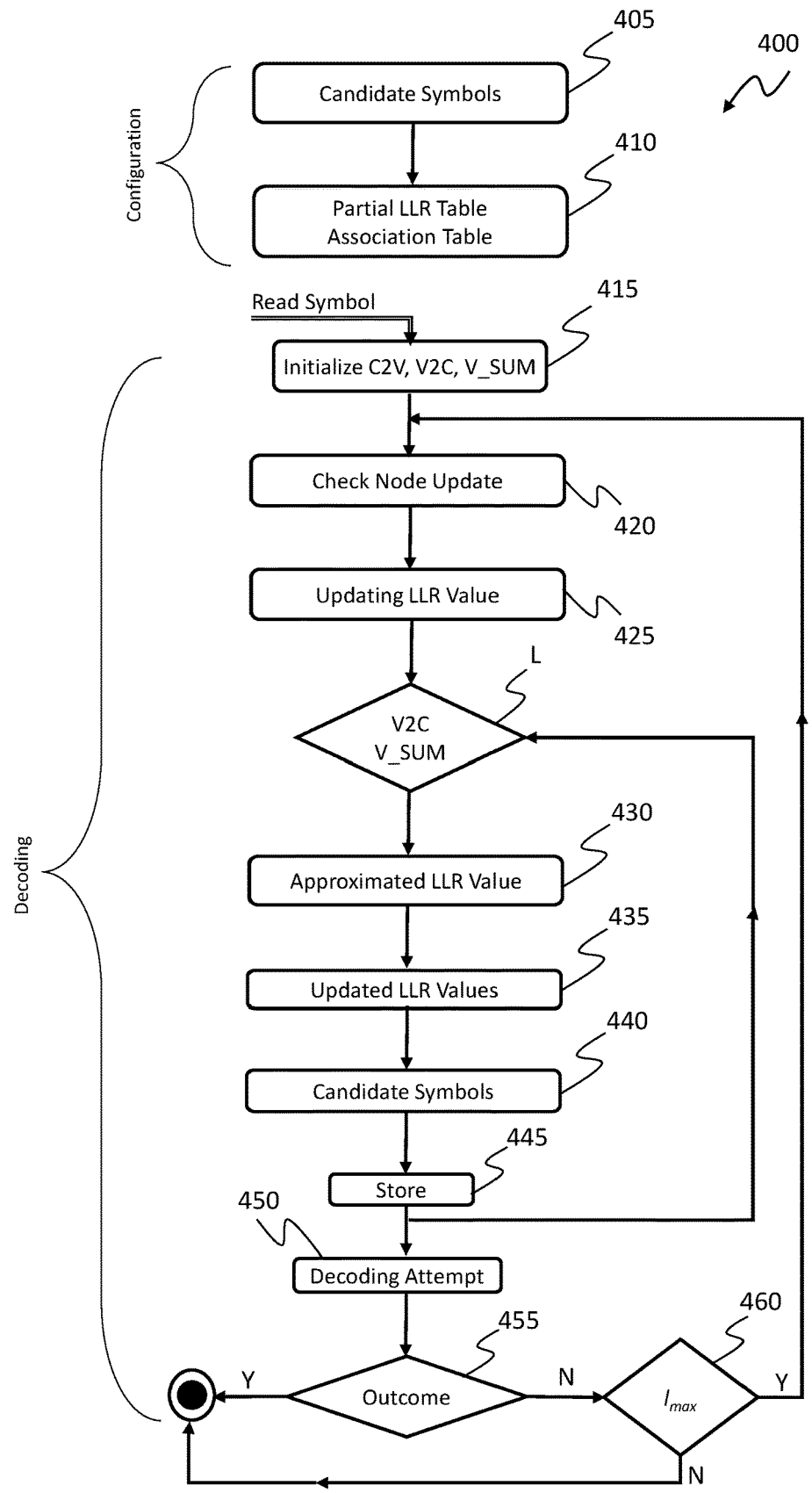

FIG. 4 schematically shown an activity diagram of a method according to embodiments of the present disclosure.

DETAILED DESCRIPTION OF PREFERRED EMBODIMENTS

In the following, when one or more features are introduced by the wording "according to an embodiment", they are to be construed as features additional or alternative to any features previously introduced, unless otherwise indicated and/or unless there is evident incompatibility among feature combinations that is immediately apparent to the person skilled in the art.

With reference to the drawings, FIG. 1 schematically shows a simplified architecture of a "Solid State Drive" device (SSD device) 100 according to embodiments of the present disclosure.

According to an embodiment, the SSD device 100 comprises a controller (e.g., a processor and/or other control circuitry, herein referred to as SSD controller) 105.

According to an embodiment, the SSD device 100 comprises a plurality of non-volatile memory chips (e.g., flash memory chips, such as NAND flash memory chips) $110_i$ for storing bits even in the absence of external power supply (i=1, 2, 3, . . . , I, with I=64 in the example at issue).

According to an embodiment, the SSD device 100 comprises a plurality of (e.g., synchronous and/or asynchronous) channels $115_j$ (j=1, 2, 3, ..., J, with J=4 in the example at issue) communicably coupling the SSD controller 105 and the memory chips $110_i$ to each other.

In the illustrated example, each channel $115_j$ communicably couples the SSD controller 105 to a set of 16 memory chips $110_i$. Particularly, in the illustrated example, the channel $115_1$ communicably couples the SSD controller 105 to the memory chips $110_1$-$110_{16}$, the channel $115_2$ communicably couples the SSD controller 105 to the memory chips $110_{17}$-$110_{32}$, the channel $115_3$ communicably couples the SSD controller 105 to the memory chips $110_{33}$-$110_{48}$, and the channel 1154 communicably couples the SSD controller 105 to the memory chips $110_{49}$-$110_{64}$.

According to an embodiment, each flash memory chip $110_i$ comprises one or more flash memory dice.

An exemplary architecture of a flash memory die of the SSD device 100 is schematically illustrated in FIG. 2A and denoted by the number reference 200.

According to an embodiment, the flash memory die 200 comprises one (as depicted) or more memory arrays 205 of memory cells (e.g., NAND flash memory cells) 210 arranged in rows and columns.

According to an embodiment, each memory array 205 is divided into multiple memory pages. Broadly speaking, each memory page comprises a number of memory cells 210 that can be programmed and read simultaneously (otherwise stated, the memory cells may be programmed and read at memory page level). A number of memory pages form a memory block, and the size of the memory block equals to the product of the size of the memory page and the total number of memory pages in the memory block.

According to an embodiment, the flash memory die 200 comprises peripheral circuits (such as decoders, multiplexers, drivers, buffers, sense amplifiers), which, being not relevant for the present description, are represented in the figure by means of a single functional block (denoted by the number reference 215). According to an embodiment, the peripheral circuits 215 may be configured for accessing selected (pages of) memory cells (as conceptually represented in the figure by arrow connection between the peripheral circuits 215 and the memory array 205) and for running selected operations thereon (e.g., write, read and/or diagnosis operations).

According to an embodiment, each memory cell 210 is programmable to store a bit or group of bits (or bit pattern) among a plurality of bit patterns. According to an embodiment, each bit pattern identifies or is associated with a respective logical state of the memory cell 210.

According to an embodiment, each memory cell 210 comprises a floating gate transistor (not illustrated). According to well-known principles of floating gate transistors, each bit pattern identifying a respective logical state of the memory cell 210 is physically stored in each memory cell 210 in the form of electric charge in the floating gate, which defines a corresponding threshold voltage of the transistor.

The number of bits each memory cell 210 is capable of storing depends on memory cell technology. For example, in "Single-Level Cell" (SLC) technology each memory cell (or SLC memory cell) is capable of storing one bit pattern comprising one bit (i.e. two logical states, 0 or 1, defining, i.e. being associated with, two threshold voltages), in "Multi-Level Cell" (MLC) technology each memory cell (or MLC memory cell) is capable of storing one bit pattern comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one bit pattern comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature and be associated with same (nominal) threshold voltages for same logical states (or, equivalently, for same bit patterns), practically each threshold voltage associated with a corresponding logical state (or, equivalently, associated with a corresponding bit pattern) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take; otherwise stated, memory cells programmed to store a same bit pattern among the plurality of bit patterns exhibit actual threshold voltages that are variable over the memory cells 210 around the corresponding nominal threshold voltage thereby defining a respective threshold voltage distribution $D_j$ associated with that same bit pattern. This is schematically shown in the top drawing of FIG. 2B for a SLC memory cell, in the top drawing of FIG. 2C for a MLC memory cell, and in the top drawing of FIG. 2D for a TCL memory cell.

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1 in the example of FIG. 2B, k=1, 2, 3 in the example of FIG. 2C, and k=1, 2, 3, 4, 5, 6, 7 in the example of FIG. 2D). Therefore, each pair of adjacent bit patterns, which are associated with a corresponding adjacent pair of nominal threshold voltages (and hence with a corresponding adjacent pair of threshold voltage distributions D1), may be discriminated, during a read operation, by a respective hard reference voltage $V_k$ which is between the corresponding adjacent nominal threshold voltages.

In the case of SLC memory cell (k=1), during a read operation a threshold voltage below the hard reference voltage $V_1$ represents the bit "1", and a threshold voltage above the hard reference voltage $V_1$ represents the bit "0".

In the case of MLC memory cell, during a read operation, a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10".

In the case of TLC memory cell and in the exemplary considered coding distributions, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell 210, the threshold voltage of the memory cell 210 is compared to the hard reference voltages $V_k$.

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B, 2C and 2D) and, hence, into increasing of the probability of the number of bit errors per unit time (i.e., the RBER).

With reference to FIG. 3A, it schematically shows a simplified architecture of the SSD controller 105 according to embodiments of the present disclosure.

The simplified architecture of the SSD controller 105 is shown in FIG. 3A in terms of operating units. The term "unit" is herein intended to emphasize functional (rather than implementation) aspects thereof (each unit including, for example, hardware or circuitry with processing and/or storing capabilities).

For the sake of completeness, FIG. 3A also shows, with a smaller size, the memory chips $110_i$ and the channels $115_j$ (only some of the memory chips being numbered in such a figure for ease of illustration).

According to an embodiment, the SSD controller 105 comprises an SSD interface unit 305.

According to an embodiment, the SSD interface unit 305 allows data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 305.

According to an embodiment, the SSD interface unit 305 may be in the form of a standardized interface. For example, when the SSD device 100 is used for data storage in a computing system, the SSD interface unit 305 may be a "Serial advanced technology attachment" (SATA), a "Peripheral Component Interconnect express" (PCIe), or a "Universal Serial Bus" (USB).

According to an embodiment, data exchanged between the SSD device 100 (through the SSD interface unit 305 of the SSD controller 105) and the host may comprise, but are not limited to, information bits to be stored (e.g., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

According to an embodiment, the SSD controller 105 comprises a control unit 310 (or more thereof) for managing SSD device 100 operation, such as for receiving and processing the user commands from the SSD interface unit 305, handling bit transport to and from the memory chips $110_i$ along the channels $115_j$ and bit transport to and from the SSD interface unit 305, and coordinating enabling and/or disabling of the memory chips $110_i$ according to the user commands.

According to an embodiment, the control unit 310 is configured to store decoding matrices allowing a decoding process (as better discussed in the following).

According to an embodiment, the SSD controller 105 comprises a "Forward Error Correction" (FEC) unit 315 for locating and correcting bit errors, so as to compensate for large "Raw Bit Error Rate" (RBER) and to increase reliability of the SSD device 100.

According to "Forward Error Correction" principles, the information bits to be stored in the memory chips $110_i$ (and provided either by the control unit 310 or, directly, from the SSD interface unit 305) are encoded in a redundant way (e.g., by adding parity bits) by means of an "Error Correction Code" (ECC code), thus obtaining a corresponding codeword, so that redundancy allows detecting a limited number of bit errors that may occur anywhere in the read bits, and to correct these errors, during decoding, without rereading.

According to an embodiment, the FEC unit 315 may comprise discrete components—such as an "Application Specific Integrated Circuit" (ASIC)—external to the control unit 310 (as herein assumed by way of example only).

According to an embodiment, the FEC unit 315 may reflect functionalities that do not necessarily have a discrete physical form separate from the control unit 310.

According to an embodiment, the SSD controller 105 comprises a memory interface unit 320 for allowing bit transport between the SSD controller 105 and the memory chips $110_i$ along the respective channels $115_j$. According to alternative embodiments, the SSD controller 105 may comprise a plurality (i.e., two or more) memory interface units: just as an example, the SSD controller 105 may comprise a memory interface unit for each channel $115_j$, or a memory interface unit for each memory chip $110_i$ (or for each group of memory chips $110_i$).

According to an embodiment, not shown, the memory interface unit 320 may be communicably coupled in a unidirectional manner to the SSD interface 305 (e.g., for receiving from it the information bits to be written when, or if, no ECC code is requested).

According to an embodiment, not shown, the memory interface unit 320 may be communicably coupled in a bi-directional manner to the control unit 310 (e.g., for receiving control information from it, such as an indication of the memory chips $110_i$ to be enabled for write or read operations, and for providing to it the read bits to be transmitted to the SSD interface unit 305).

According to an embodiment, as conceptually depicted in the figure by bi-directional arrow connection, the memory interface unit 320 may be communicably coupled in a bi-directional manner to the FEC unit 315 (e.g., for receiving from it encoded bits including the information and parity bits, and for providing to it the read bits to be decoded before transmitting to the control unit 310, and hence to the SSD interface unit 305, the read information bits).

According to an embodiment, the SSD controller 105 comprises a memory unit (e.g., a "Random Access Memory", RAM) 325 communicably coupled (e.g., in a bi-directional manner) to the control unit 310.

According to an embodiment, the memory unit 325 may be configured to receive (from the control unit 310) and store statistical information (such as number of program/erase cycles, and number of bit errors) and/or diagnostic information (such as working temperature, power consumption) retrieved and/or calculated by the control unit 310 (e.g. based on SSD device 100 operation and/or on sensors and/or diagnostic circuits within the SSD device 100, not shown), and, when required, to feed the control unit 310 with the stored information.

According to an embodiment, the SSD controller 105 comprises an encoding unit 330 for encoding the bits to be stored in the memory array (i.e., the information bits) by means of an ECC code. According to an embodiment, as illustrated, the encoding unit 330, and the respective decoding unit (discussed in the following), are implemented in the FEC unit 315.

Preferably, the ECC code is an ECC code allowing soft decoding—or, otherwise stated, an ECC code that allows determining each bit value by means of hard bits (i.e., the read bits resulting from comparisons to the hard reference voltages $V_k$) and of additional information including soft bits and an indication of the reliability of each read (hard and soft) bit typically evaluated or estimated according to RBER. More preferably, the ECC code is a "Low-Density Parity-Check" (LDPC) code—hence, the encoding unit 330 will be referred to as LDPC encoding unit 330 and the corresponding encoded bits will be referred to as LDPC encoded bits.

LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate—i.e., the ratio between the information bits to the encoding unit (i.e., the LDPC encoding unit, in the example at issue) and the total number of bits created by the encoding unit (the total number of bits created by the encoding unit including the parity bits)—LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

According to the preferred embodiment herein considered, the LDPC code used to encode the bits to be stored in the memory array is a non-binary LDPC code (i.e. a Q-ary LDPC code ($Q \neq 2$)) defined over a binary-extension Galois field $GF(2^r)$—from now on, whenever LDPC code is mentioned, it should be taken to mean the non-binary (i.e., Q-ary) LDPC code defined over a binary-extension Galois field $GF(2^r)$. A finite field or Galois field (GF) is a field that contains a finite number of elements: as with any field, a Galois field is a set on which the operations of multiplication, addition, subtraction and division are defined and satisfy certain basic rules.

According to an embodiment, as conceptually depicted in the figure by unidirectional arrow connection, the LDPC encoding unit 330 may be communicably coupled in a unidirectional manner to the memory interface unit 320 (e.g., for providing it with the LDPC encoded bits (i.e., the encoded codeword) to be stored in the memory chips $110_i$). In the exemplary illustrated embodiment, the LDPC encoded bits are fed directly to the memory interface unit 320, however this should not be construed limitatively: indeed, depending on the specific implementation, the LDPC encoded bits may be subject to additional processing before their storing in the memory chips $110_i$.

According to an embodiment, the SSD controller 105 comprises a mapping unit 335 for "mapping" the read bits into a plurality of symbols.

According to an embodiment, each read bit comprises a bit value and a reliability thereof.

According to an embodiment, the bit value and the reliability thereof are determined based on a number of (typically, multiple) readings. These multiple readings may comprise one or more hard readings (i.e. the read operations at the hard reference voltages $V_k$) and/or one or more soft readings (i.e. the read operations at the soft reference voltages $V_{kA}$-$V_{kF}$, with the soft reference voltages $V_{kA}$-$V_{kc}$ that may for example be obtained by progressively decreasing the hard reference voltage $V_k$ by a 0.5V step, and with the soft reference voltages $V_{kD}$-$V_{kF}$ that may for example be obtained by progressively increasing the hard reference voltage $V_k$ by a 0.5V step).

According to an embodiment, the mapping unit 335 is configured to map groups of r read bits into respective read symbols (among $2^r$ possible symbols) each one associated with $2^r$ LLR values. As better discussed in the following, each of the $2^r$ ("Log Likelihood Ratio") LLR values associated with a read symbol denotes a symbol probability indicative that the read symbol was equal to a respective one among $2^r$ possible symbols before being corrupted by channel noise effects.

According to an embodiment, each of the $2^r$ LLR values associated with a read symbol are determined (e.g., at the mapping unit 335) based on the reliabilities of the respective bit values (see, for example, Joan Bas, Stephan Pfletschinger, "*Symbol vs bit-wise LLR estimation for non-binary LDPC codes*", which is incorporated herein by reference).

According to an embodiment, the SSD controller 105 comprises a decoding unit 340 for decoding the symbols in order to extract the information bits therefrom.

According to an embodiment, the decoding unit 340 may comprise a channel decoder (not shown) for reconstructing the complete codeword from the received codeword and any inserted soft bits, and a data decoder (not shown) for removing the redundant bits included in the codeword to produce the original input data from the reconstructed codeword.

According to an embodiment, said decoding is based on a Tanner graph representing a parity-check matrix which identifies the LDPC code.

A Tanner graph is an effective graphical representation for LDPC codes (R. M. Tanner, "A recursive approach to low complexity codes", IEEE Trans. Inform. Theory, 27(5):533-547, 1981, which is incorporated herein by reference); particularly, for each parity-check matrix identifying the LDPC code, exists a corresponding bipartite Tanner graph having variable nodes and check nodes, wherein the number of check nodes equals the number of parity-check bits in the codeword (in turn corresponding to the number of rows of the parity-check matrix) and the number of variable nodes equals to the number of bits in the codeword (in turn corresponding to the number of columns of the parity-check matrix), and wherein each check node is connected to a variable node (through the so-called "edge") when the corresponding element of the parity-check matrix is non-zero.

Considering, just as an example, the following parity-check matrix H:

$$H = \begin{pmatrix} 1 & 0 & 1 & 1 & 0 \\ 1 & 1 & 1 & 0 & 1 \end{pmatrix}$$

denoting by $c_1$, $c_2$ the check nodes, and by $v_1$, $v_2$, $v_3$, $v_4$, $v_5$ the variable nodes, the Tanner graph illustrated in FIG. 3B would be obtained.

According to an embodiment, said decoding is based on message passing between variable and check nodes along the edges of the Tanner graph.

According to an embodiment, the decoding is based on a processing of a matrix indicative of messages from check nodes to variable nodes exchanged by means of a message passing computation rule (hereinafter referred to as C2V matrix), a matrix indicative of messages from variable nodes to check nodes exchanged by means of a message passing computation rule (hereinafter referred to as V2C matrix), and a matrix providing a decoding attempt for the read symbol (hereinafter referred to as V_SUM matrix). In the following, the C2V matrix, the V2C matrix and the V_SUM matrix will be also referred to globally as decoding matrices.

According to the principles of the present disclosure, reduced size decoding matrices are used during decoding (possibly, by temporarily reconstructing complete or full-size decoding matrices from the respective reduced sized decoding matrices).

FIG. 4 schematically shows an activity diagram of a method 400 according to embodiments of the present disclosure.

According to an embodiment, the method 400 comprises a configuration process (nodes 405-410) and a decoding process (nodes 415-460).

Configuration Process

According to an embodiment, the configuration process is performed after a characterization phase of the SSD device.

According to an embodiment, during the characterization phase of the SSD device, each i-th read symbol $S_i$ (among the $2^r$ possible symbols) is associated with $2^r$ LLR ("Log Likelihood Ratio") values $LLR_{i,j}$ each one denoting a symbol probability indicative of a probability that the i-th read symbol $S_i$ was equal to a respective one (j-th) among the $2^r$ possible symbols S, before being corrupted by channel noise effects.

Considering, just as an example, r=8, 256 (i.e., $2^8$) LLR values $LLR_{i,j}$ are obtained, each one denoting a symbol probability indicative of the probability that the i-th read symbol $S_i$ (i=0, 1, 2, 3, 4, ..., 255) was equal to the j-th possible symbol $S_j$ (j=0, 1, 2, 3, 4, ..., 255) before being corrupted by channel noise effects.

Just as an example, the LLR value $LLR_{0,0}$ denotes the probability that the read symbol $S_0$ was equal to the possible symbol $S_0$, the LLR value $LLR_{1,2}$ denotes the probability that the read symbol $S_1$ was equal to the possible symbol $S_2$, the LLR value $LLR_{2,3}$ denotes the probability that the read symbol $S_2$ was equal to the possible symbol $S_3$, the LLR value $LLR_{4,255}$ denotes the probability that the read symbol $S_4$ was equal to the possible symbol $S_{255}$, and the LLR value $LLR_{255,2}$ denotes the symbol probability indicative that the read symbol $S_{255}$ was equal to the possible symbol $S_2$.

By way of example only, an LLR value $LLR_{i,j}$ equal to 0 may indicate or correspond to a highest symbol probability, and progressively increasing LLR values $LLR_{i,j}$ higher than 0 may indicate or correspond to progressively decreasing symbol probabilities.

Therefore, according to an embodiment, during the characterization phase of the SSD device, an LLR table comprising $2^r$ rows (each one corresponding to a respective i-th read symbol) and $2^r$ columns (each one corresponding to a respective j-th possible symbol) is obtained (wherein each element (i,j) of the LLR table comprises a respective LLR value $LLR_{i,j}$).

In the example at issue (r=8), an LLR table comprising 256 rows and 256 columns is obtained:

|  | $S_0$ | $S_1$ | $S_2$ | $S_3$ | $S_4$ | ... | $S_{255}$ |
|---|---|---|---|---|---|---|---|
| $S_0$ | $LLR_{0,0}$ | $LLR_{0,1}$ | $LLR_{0,2}$ | $LLR_{0,3}$ | $LLR_{0,4}$ | ... | $LLR_{0,255}$ |
| $S_1$ | $LLR_{1,0}$ | $LLR_{1,1}$ | $LLR_{1,2}$ | $LLR_{1,3}$ | $LLR_{1,4}$ | ... | $LLR_{1,255}$ |
| $S_2$ | $LLR_{2,0}$ | $LLR_{2,1}$ | $LLR_{2,2}$ | $LLR_{2,3}$ | $LLR_{2,4}$ | ... | $LLR_{2,255}$ |
| $S_3$ | $LLR_{3,0}$ | $LLR_{3,1}$ | $LLR_{3,2}$ | $LLR_{3,3}$ | $LLR_{3,4}$ | ... | $LLR_{3,255}$ |
| $S_4$ | $LLR_{4,0}$ | $LLR_{4,1}$ | $LLR_{4,2}$ | $LLR_{4,3}$ | $LLR_{4,4}$ | ... | $LLR_{4,255}$ |
| . | . | . | . | . | . |  | . |
| . | . | . | . | . | . |  | . |
| $S_{255}$ | $LLR_{255,0}$ | $LLR_{255,1}$ | $LLR_{255,2}$ | $LLR_{255,3}$ | $LLR_{255,4}$ | ... | $LLR_{255,255}$ |

As should be understood, although $2^r \times 2^r$ LLR values $LLR_{i,j}$ are represented in the LLR table (i.e., from $LLR_{0,0}$ to $LLR_{255,255}$), in practical cases the LLR values $LLR_{i,j}$ may fall within a (limited) set of discrete values (hereinafter, LLR value set). According to an embodiment, the LLR value set may depend on a channel model being used for modelling the channel noise effects on symbol corruption. Examples of channel models include, but are not limited to, "Additive White Gaussian Noise" (AWGN) channel model, "Binary Erasure Channel" (BEC) model, "Binary Symmetric Channel" (BSC) model, and "Gaussian Channel" (GC) model.

Just as a numerical example, in case of "Additive White Gaussian Noise" (AWGN) channel model, the following LLR value set (denoted by $LLR_{SET}$) may be obtained for BER=0.0104:

$LLR_{SET}$={0,46,91,137,182,228,273,319,364}

According to an embodiment, the method 400 comprises, during the configuration process, storing the LLR value set $LLR_{SET}$ in a proper memory location of the SSD device, for example in a proper memory location of the control unit (so as to allow updating the decoding matrices, as better discussed in the following).

According to an embodiment, the method 400 comprises, during the configuration process, storing, for each of the $2^r$ read symbols $S_i$, a subset of the respective $2^r$ LLR values $LLR_{i,j}$ (and the respective subset of $2^r$ possible symbols $S_j$) resulting from the LLR table (as discussed here below in connection with action nodes 405 and 410).

According to an embodiment, the method 400 comprises, based on the LLR table, associating (action node 405), with each i-th read symbol $S_i$ of the $2^r$ read symbols, a plurality of mutually-different candidate symbols, wherein the plurality of candidate symbols comprises, for the i-th read symbol $S_i$, a predetermined number N of the $2^r$ possible symbols $S_j$ for which the LLR values $LLR_{i,j}$ associated with the i-th read symbol $S_i$ are indicative of the highest symbol probabilities.

According to an embodiment, the plurality of candidate symbols associated with the i-th read symbol $S_i$ comprise a predetermined number N of the possible symbols $S_j$ that are the closest, in terms of a distance relationship, to the i-th read symbol $S_i$.

According to an embodiment, the distance relationship may depend on the channel model. Just as an example, in case of AWGN channel model, the distance relationship may be a binary distance. In the above numerical example of LLR value set $LLR_{SET}$, the plurality of candidate symbols associated with the i-th read symbol $S_i$ comprise the j-th possible symbol $S_j$ associated with the highest symbol probability (i.e., $LLR_{i,j}=0$ in the considered example in which an LLR value $LLR_{i,j}$ equal to 0 indicates or corresponds to the highest symbol probability) and N−1 possible symbols $S_j$ whose LLR values $LLR_{i,j}$ are the closest to 0 (e.g., N−1 possible symbols with LLR value $LLR_{i,j}$ equal to 46 in the above numerical example of LLR value set $LLR_{SET}$).

As should be understood, depending on the choice of N, only a subset of the possible symbols $S_j$ that are closest to the i-th read symbol $S_i$ may result to be candidate symbols. According to an embodiment, this choice is performed arbitrarily: indeed, as better understood from the following disclosure, the present disclosure provides for a mechanism that allows possible symbols initially not included among the N candidate symbols, to be included in it after one or more decoding iterations.

According to an embodiment, the method 400 comprises storing the plurality of candidate symbols and the LLR values associated therewith (action node 410), with the possible symbols other than the plurality of candidate symbols (hereinafter referred to as excluded symbols), and the respective LLR values, which are excluded from storing.

According to an embodiment, the method 400 comprises storing a partial LLR table comprising, for each of the $2^r$ read symbols $S_i$, the N LLR values associated with the N candidate symbols (action node 410). In other words, the partial LLR table resulting from the configuration process is (compared to the $2^r \times 2^r$ full-size LLR table) a reduced-size LLR table comprising, for each of the $2^r$ read symbols $S_i$, only the respective N LLR values $LLR_{i,j}$ indicative of the highest symbol probabilities.

Considering, just as an example, N=5, and denoting by $LLR_{i,A}$, $LLR_{i,B}$, $LLR_{i,C}$, $LLR_{i,D}$, $LLR_{i,E}$ the LLR values $LLR_{i,j}$ indicative of the highest symbol probabilities (e.g., ordered by decreasing symbol probability) associated with the respective i-th read symbol $S_i$ (i.e., with each of the LLR values $LLR_{i,A}$, $LLR_{i,B}$, $LLR_{i,C}$, $LLR_{i,D}$, $LLR_{i,E}$ that is one of the $2^r$ LLR values $LLR_{i,j}$ associated with the i-th read symbol and included in the LLR table), for the considered case in which r=8 the partial LLR table would result in a 256×5 (i.e., $2^r \times N$) table:

| $S_0$ | $LLR_{0,A}$ | $LLR_{0,B}$ | $LLR_{0,C}$ | $LLR_{0,D}$ | $LLR_{0,E}$ |
|---|---|---|---|---|---|
| $S_1$ | $LLR_{1,A}$ | $LLR_{1,B}$ | $LLR_{1,C}$ | $LLR_{1,D}$ | $LLR_{1,E}$ |
| $S_2$ | $LLR_{2,A}$ | $LLR_{2,B}$ | $LLR_{2,C}$ | $LLR_{2,D}$ | $LLR_{2,E}$ |
| $S_3$ | $LLR_{3,A}$ | $LLR_{3,B}$ | $LLR_{3,C}$ | $LLR_{3,D}$ | $LLR_{3,E}$ |
| $S_4$ | $LLR_{4,A}$ | $LLR_{4,B}$ | $LLR_{4,C}$ | $LLR_{4,D}$ | $LLR_{4,E}$ |
| . | . | . | . | . | . |
| $S_{255}$ | $LLR_{255,A}$ | $LLR_{255,B}$ | $LLR_{255,C}$ | $LLR_{255,D}$ | $LLR_{255,E}$ |

In the following, the LLR values indicative of the highest symbol probabilities will be concisely referred to as h-LLR values.

According to an embodiment, the method 400 comprises storing an association table comprising, for each of the $2^r$ read symbols $S_i$, the respective N candidate symbols (action node 410). According to an embodiment, for each i-th read symbol $S_i$, the respective N candidate symbols in the association table are ordered according to the ordering of the h-LLR values $LLR_{i,A}$, $LLR_{i,B}$, $LLR_{i,C}$, $LLR_{i,D}$, $LLR_{i,E}$ in the partial LLR table (so that the association of a candidate symbol with a h-LLR value results from same positions taken by that candidate symbol and by that h-LLR value in the respective tables). In the example herein considered in which r=8 and N=5, denoting by $S(LLR_{i,A})$, $S(LLR_{i,B})$, $S(LLR_{i,C})$, $S(LLR_{i,D})$, $S(LLR_{i,E})$ the candidate symbols associated with the h-LLR values $LLR_{i,A}$, $LLR_{i,B}$, $LLR_{i,C}$, $LLR_{i,D}$, $LLR_{i,E}$ of the i-th read symbol, the association table would result in a 256×5 (i.e., $2^r \times N$) table:

| $S_0$ | $S(LLR_{0,A})$ | $S(LLR_{0,B})$ | $S(LLR_{0,C})$ | $S(LLR_{0,D})$ | $S(LLR_{0,E})$ |
|---|---|---|---|---|---|
| $S_1$ | $S(LLR_{1,A})$ | $S(LLR_{1,B})$ | $S(LLR_{1,C})$ | $S(LLR_{1,D})$ | $S(LLR_{1,E})$ |
| $S_2$ | $S(LLR_{2,A})$ | $S(LLR_{2,B})$ | $S(LLR_{2,C})$ | $S(LLR_{2,D})$ | $S(LLR_{2,E})$ |
| $S_3$ | $S(LLR_{3,A})$ | $S(LLR_{3,B})$ | $S(LLR_{3,C})$ | $S(LLR_{3,D})$ | $S(LLR_{3,E})$ |
| $S_4$ | $S(LLR_{4,A})$ | $S(LLR_{4,B})$ | $S(LLR_{4,C})$ | $S(LLR_{4,D})$ | $S(LLR_{4,E})$ |
| . | . | . | . | . | . |
| $S_{255}$ | $S(LLR_{255,A})$ | $S(LLR_{255,B})$ | $S(LLR_{255,C})$ | $S(LLR_{255,D})$ | $S(LLR_{255,E})$ |

Thus, contrary to the known solutions, which provide for storing the $2^r \times 2^r$ (full-size) LLR table, the present disclosure provides for storing a $2^r \times N$ partial LLR table and a $2^r \times N$ association table. Therefore, the more N is lower than $2^r$, the greater the advantage in terms of area occupation and computation complexity. In the example herein considered in which r=8 and N=5, a significant reduction in the area occupation may be achieved.

As will be better understood from the following discussion of the decoding process, the reduced size of the partial LLR table and of the association table resulting from the configuration process determines a corresponding size reduction in the decoding matrices, and hence a significant reduction in computation complexity may be achieved.

Decoding Process

According to an embodiment, the decoding process is performed by the decoding unit during a normal operation of the SSD device (i.e., after the characterization phase and the configuration process).

According to an embodiment, the decoding process is performed by the decoding unit upon reception (at the decoding unit) of the i-th read symbol $S_i$, or, in a practical scenario, upon reception (at the decoding unit) of a read codeword including a plurality of read symbols.

In the following, the decoding process will be discussed at read symbol level for the sake of description ease and conciseness, it being understood that an equivalent discussion apply when considering the decoding process at read codeword level.

According to an embodiment, the decoding process comprises an initialization phase (action node 415) and an iterative decoding phase (nodes 420-460) following the initialization phase.

According to an embodiment, the method 400 comprises, during the initialization phase, initializing the V2C matrix and the V_SUM matrix based on the partial LLR table and on the association table (action node 415).

According to an embodiment, the method 400 comprises, at action node 415, storing, for the i-th read symbol $S_i$, the respective plurality of candidate symbols and the LLR values associated therewith (i.e., the h-LLR values associated with the i-th read symbol $S_i$) in the V2C matrix and in the V_SUM matrix, with the respective possible symbols other than the respective plurality of candidate symbols (hereinafter referred to as excluded symbols or excluded symbols associated with the i-th read symbol $S_i$), and the respective LLR values, which are excluded from storing.

According to an embodiment, the storing (in the V2C matrix and in the V_SUM matrix) of the candidate symbols and of the LLR values associated therewith determines the initialization of the V2C matrix and of the V_SUM matrix.

According to an embodiment, as a result of said initialization, the V2C matrix and the V_SUM matrix are identified each one by a respective LLR matrix comprising, for the i-th read symbol $S_i$, only the respective N LLR values $LLR_{i,j}$ indicative of the highest symbol probabilities (as resulting from the partial LLR table), and by a respective association matrix comprising, for the i-th read symbol $S_i$, the respective N candidate symbols (as resulting from the association table). In other words, the V2C matrix and the V_SUM matrix are initialized with the items of the partial LLR table and of the association table that are associated with the i-th read symbol $S_i$.

According to the known solutions, initialization of the V2C matrix and of the V_SUM matrix is performed by storing, for the i-th read symbol $S_i$, (all) the respective $2^r$ LLR values $LLR_{i,j}$ resulting from the LLR table. Therefore, the known solutions provide for processing decoding matrices with $2^r$ elements for each read symbol.

According to the present disclosure, initialization of the V2C matrix and of the V_SUM matrix is performed by storing, for the i-th read symbol $S_i$, a subset of the respective $2^r$ LLR values $LLR_{i,j}$ (and the respective subset of $2^r$ possible symbols $S_j$), hence the present disclosure provides for storing and processing reduced-size decoding matrices.

According to an embodiment, the method 400 comprises initializing the C2V matrix (action node 415). According to an embodiment, the C2V matrix is initialized by setting all elements thereof at 0. According to an embodiment, the C2V matrix has a (reduced) size that reflects the reduced size of the V2C matrix and of the V_SUM matrix (as better understood from the following discussion of an exemplary check node update procedure). According to an embodiment, the C2V matrix has a structure that reflects the structure of the V2C matrix and of the V_SUM matrix, i.e. it is identified by a $2^r \times N$ partial LLR table and by a $2^r \times N$ association table.

According to an embodiment, as mentioned above, the message passing computation rule, which defines check node and variable node update procedures of the decoding process, may be based on "Belief Propagation" (BP) algorithm, or an approximation thereof (such as "Min-Sum" (MS) algorithm, "Extended Min-Sum" (EMS) algorithm, "Scaled Min-Sum" (SMS) algorithm, "Normalized Min-Sum" (NMS) or "Layered Min-Sum" (LMS) algorithms). In the following, the EMS algorithm will be considered by way of example only.

According to an embodiment, the method 400 comprises, based on the V2C matrix, performing a check node update procedure (action node 420) to update the C2V matrix (or, equivalently, to update the check-node output messages).

According to an embodiment, the check node update procedure is based on EMS algorithm and on forward-backward recursion scheme. A discussion of the forward-backward recursion scheme may be found in A. Voicila, D. Declercq, F. Verdier, M. Fossorier and P. Urard, *"Low-Complexity Decoding for non-binary LDPC Codes in High Order Fields"*, IEEE Trans, on Commun., vol. 58(5), pp 1365-1375, May 2010, which is incorporated herein by reference.

According to the EMS algorithm and to forward-backward recursion scheme, the check note update procedure is based on recursive construction of a forward matrix (hereinafter, FW matrix) and of a backward matrix (hereinafter, BW matrix), and on a combination of the FW and BW matrices.

Each one of the FW and BW matrices (hereinafter, concisely, FW/BW matrix) is constructed recursively through combinations of its rows and permuted rows of the V2C matrix. In order to compute the $2^r$ LLR values of a new row of the FW/BW matrix, the previous row of the FW/BW matrix and a permuted row of the V2C depending on the parity-check matrix are combined to each other.

The combination of a FW/BW matrix row and of a V2C matrix row comprises:
  i) selection of NM most probable symbols of the row of the V2C matrix, where NM is a fixed number, smaller or equal than $2^r$;
  ii) computation of $2^r \times NM$ value pairs, each one comprising a LLR value and a symbol. For each value pair, the LLR value is the sum between an LLR value of the row of the FW/BW matrix and one among the selected NM LLR values of the V2C matrix, while the symbol is the XOR of their positions in the respective rows;
  iii) the LLR value in position x of the new row of the FW/BW matrix is the minimum LLR value among those whose second element in the value pair is equal to x.

The combination of the FW and BW matrices is performed by combining to each other the rows of the FW and BW matrices, without reduction from $2^r$ to NM: hence, for each row combination, $2^r \times 2^r$ value pairs are computed and stored in the C2V matrix.

Considering instead the size reduction of the V2C matrix according to the present disclosure, and considering NM=N, the combination of a FW/BW matrix row and of a V2C matrix row results in same steps i), ii), iii), but the number of value pairs to compute is NM×NM (due the reduced sizes of all the involved matrices). As a consequence, the C2V matrix is size-reduced too.

Operating on reduced size matrices allows memory saving and computation reduction during the check node updating procedure. Although these advantages have been discussed in connection with the EMS algorithm adopting forward-backward recursion scheme, similar considerations apply when considering other algorithms implementing the message passing computation rule.

According to an embodiment, the method 400 comprises performing a variable node update procedure (see nodes 425-460).

According to an embodiment, the method 400 comprises, for the i-th read symbol, determining, based on the decoding matrices, an updating LLR value $\delta_{LLRi,j}$ for each j-th possible symbol among the $2^r$ possible symbols associated with the i-th read symbol (action node 425), i.e. for both the respective N candidate symbols and the respective excluded symbols.

According to an embodiment, the updating LLR value $\delta_{LLRi,j}$ for each j-th possible symbol associated with the i-th read symbol is based, for each decoding matrix (i.e., for the V2C matrix, for the V_SUM matrix and for the C2V matrix), on the corresponding h-LLR value $LLR_{i,j}$ associated with the j-th possible symbol if the j-th possible symbol $S(LLR_{i,j})$ is one of the N candidate symbols for the i-th read symbol.

Just as an example, let be considered the read symbol $S_0$ (i.e., $S_i=S_0$) and the possible symbol $S_2$, and let be exemplary considered that the h-LLR values $LLR_{0,A}$, $LLR_{0,B}$, $LLR_{0,C}$, $LLR_{0,D}$, $LLR_{0,E}$ associated with the read symbol $S_0$ correspond, in each decoding matrix, to the possible symbols $S_0$, $S_2$, $S_4$, $S_6$ and $S_8$ (i.e., $S(LLR_{0,A})=S_0$, $S(LLR_{0,B})=S_2$, $S(LLR_{0,C})=S_4$, $S(LLR_{0,D})$, $S_6$, and $S(LLR_{0,E})=S_8$), then the updating LLR value $\delta_{LLR0,2}$ is based on the h-LLR value $LLR_{0,B}$ taken from the C2V matrix, on the h-LLR value $LLR_{0,B}$ taken from the V_SUM matrix, and on the h-LLR value $LLR_{0,B}$ taken from the V2C matrix.

According to an embodiment, the updating LLR value $\delta_{LLRi,j}$ for each j-th possible symbol $S_j$ associated with the i-th read symbol $S_i$ is based, for each decoding matrix (i.e., for the V2C matrix, for the V_SUM matrix and for the C2V matrix), on a corresponding estimate of the LLR value (hereinafter, LLR value estimate) associated with the j-th possible symbol $S_j$ if the j-th possible symbol $S_j$ is not one of the N candidate symbols for the i-th read symbol $S_i$ (or, otherwise stated, if the j-th possible symbol $S_j$ is an excluded symbol for the i-th read symbol $S_i$).

Back to the previous example, the updating LLR value $\delta_{LLR0,1}$ is based on an LLR value estimate being estimated for the possible symbol $S_1$ for the C2V matrix, on an LLR value estimate being estimated for the possible symbol $S_1$ for the V_SUM matrix, and on an LLR value estimate being estimated for the possible symbol $S_1$ for the V2C matrix (in that, in this example, the possible symbol $S_1$ is an excluded symbol in each decoding matrix).

In these examples, the simplified (and unpractical) case has been considered in which the h-LLR values $LLR_{i,A}$, $LLR_{i,B}$, $LLR_{i,C}$, $LLR_{i,D}$, $LLR_{i,E}$ associated with the i-th read symbol $S_i$ correspond to same respective possible symbols in all the decoding matrices.

However, in practical and real cases, for each i-th read symbol $S_i$, the h-LLR values $LLR_{i,A}$, $LLR_{i,B}$, $LLR_{i,C}$, $LLR_{i,D}$, $LLR_{i,E}$ may be (or are expected to be) associated with respective and (at least partially) different possible symbols throughout the decoding matrices. Therefore, in practical and real cases, for each j-th possible symbol $S_j$ associated with the i-th read symbol $S_i$, the updating LLR value $\delta_{LLRi,j}$ is based:

- on the h-LLR value $LLR_{i,j}$ associated with the j-th possible symbol $S_j$ in the C2V matrix, if the j-th possible symbol $S_j$ corresponds to a candidate symbol in the C2V matrix, or on an LLR value estimate $LLR_{EST1(i,j)}$ if the j-th possible symbol $S_j$ does not correspond to a candidate symbol in the C2V matrix (i.e., if the j-th possible symbol $S_j$ corresponds to an excluded symbol in the C2V matrix);
- on the h-LLR value $LLR_{i,j}$ associated with the j-th possible symbol $S_j$ in the V_SUM matrix, if the j-th possible symbol $S_j$ corresponds to a candidate symbol in the V_SUM matrix, or on an LLR value estimate $LLR_{EST2(i,j)}$ if the j-th possible symbol $S_j$ does not correspond to a candidate symbol in the V_SUM matrix (i.e., if the j-th possible symbol $S_j$ corresponds to an excluded symbol in the V_SUM matrix), and
- on the h-LLR value $LLR_{i,j}$ associated with the j-th possible symbol $S_j$ in the V2C matrix, if the j-th possible symbol $S_j$ corresponds to a candidate symbol in the V2C matrix, or on an LLR value estimate $LLR_{EST3(i,j)}$ if the j-th possible symbol $S_j$ does not correspond to a candidate symbol in the V2C matrix (i.e., if the j-th possible symbol $S_j$ corresponds to an excluded symbol in the V2C matrix).

Denoting by $d_{1(i,j)}$ the h-LLR value $LLR_{i,j}$ or the LLR value estimate $LLR_{EST1(i,j)}$ (as the case may be) associated with the j-th possible symbol in the C2V matrix, by $d_{2(i,j)}$ the h-LLR value $LLR_{i,j}$ or the LLR value estimate $LLR_{EST2(i,j)}$ (as the case may be) associated with the j-th possible symbol in the V_SUM matrix, and by $d_{3(i,j)}$ the h-LLR value $LLR_{i,j}$ or the LLR value estimate $LLR_{EST1(i,j)}$ (as the case may be) associated with the j-th possible symbol in the V2C matrix, according to an embodiment the updating LLR value $\delta_{LLRi,j}$ (to be used for updating both the V2C matrix and the V_SUM matrix, as better discussed in the following) may be determined based on a linear combination between $d_{1(i,j)}$, $d_{2(i,j)}$ and $d_{3(i,j)}$.

Just as an example, the updating LLR value $\delta_{LLRi,j}$ may be determined as:

$$\delta_{LLRi,j}=d_{1(i,j)}-(d_{2(i,j)}-d_{3(i,j)})$$

Therefore, in this example, at each current iteration, the updating LLR value $\delta_{LLRi,j}$ is indicative of a LLR value difference arising from check node update procedure performed at the current iteration (see $d_{1(i,j)}$ parameter, which is derived from the updated C2V resulting from check node update procedure) and the variable node update procedure performed at a previous iteration preceding the current iteration (see $d_{2(i,j)}$ parameter and $d_{3(i,j)}$ parameter, which are derived, respectively, from the V_SUM matrix and the V2C matrix that the ongoing variable node update procedure is aimed at updating).

According to an embodiment, for each decoding matrix, the LLR value estimate for the j-th possible symbol is based, for the i-th read symbol $S_i$, on the respective h-LLR value, among the respective h-LLR values associated with the N candidate symbols, indicative of the lowest symbol probability, and on a respective correction factor. According to an embodiment, the correction factor allows reducing a magnitude of the LLR messages so as to compensate a reliability overestimation inherently introduced by the EMS algorithm.

According to an embodiment, for the C2V matrix, the LLR value estimate $LLR_{EST1(i,j)}$ for the j-th possible symbol may be determined as:

$$LLR_{EST1(i,j)}=AF \times LLR^*_{i,j}$$

wherein:

$LLR^*_{i,j}$ denotes the h-LLR value, among the h-LLR values associated with the N candidate symbols (of the row relating to the i-th read symbol $S_i$ of the C2V matrix) indicative of the lowest symbol probability. In the example of above in which the h-LLR values $LLR_{i,A}$, $LLR_{i,B}$, $LLR_{i,C}$, $LLR_{i,D}$, $LLR_{i,E}$ are ordered by decreasing symbol probability, $LLR^*_{i,j}=LLR_{i,E}$, and AF is a correction factor. According to an embodiment, the correction factor comprises a positive constant depending on a distance relationship between the i-th read symbol $S_i$ and the excluded symbol in the C2V matrix. According to an embodiment, the correction factor AF may be chosen according to design needs, for example in order to reduce a number of iterations required for the decoding procedure (thus increasing decoding speed).

According to an embodiment, for the V_SUM matrix, the LLR value estimate $LLR_{EST2(i,j)}$ for the j-th possible symbol may be determined as:

$$LLR_{EST2(i,j)} = LLR^*_{i,j} + LLR_{OFFSET2(i,j)}$$

wherein:
$LLR^*_{i,j}$ denotes the h-LLR value, among the h-LLR values associated with the N candidate symbols (of the row relating to the i-th read symbol $S_i$ of the V_SUM matrix), indicative of the lowest symbol probability. In the example of above in which the h-LLR values $LLR_{i,A}$, $LLR_{i,B}$, $LLR_{i,C}$, $LLR_{i,D}$, $LLR_{i,E}$ are ordered by decreasing symbol probability, $LLR^*_{i,j} = LLR_{i,E}$, and
$LLR_{OFFSET2(i,j)}$ is an offset LLR value determined for the excluded (j-th) symbol associated with the i-th read symbol of the V_SUM matrix. According to an embodiment, the offset LLR value $LLR_{OFFSET2(i,j)}$ is a correction factor indicative of a distance relationship between the j-th excluded symbol $S_j$ and the i-th read symbol $S_i$ in the V_SUM matrix (as better discussed here below).

According to an embodiment, for the V2C matrix, the LLR value estimate $LLR_{EST3(i,j)}$ for the j-th possible symbol may be determined as:

$$LLR_{EST3(i,j)} = LLR^*_{i,j} + LLR_{OFFSET3(i,j)}$$

wherein:
$LLR^*_{i,j}$ denotes the h-LLR value, among the h-LLR values associated with the N candidate symbols (of the row relating to the i-th read symbol $S_i$ of the V2C matrix), indicative of the lowest symbol probability. In the example of above in which the h-LLR values $LLR_{i,A}$, $LLR_{i,B}$, $LLR_{i,C}$, $LLR_{i,D}$, $LLR_{i,E}$ are ordered by decreasing symbol probability, $LLR^*_{i,j} = LLR_{i,E}$, and
$LLR_{OFFSET3(i,j)}$ is an offset LLR value determined for the excluded (j-th) symbol associated with the i-th read symbol of the V2C matrix. According to an embodiment, the offset LLR value $LLR_{OFFSET3(i,j)}$ is a correction factor indicative of a distance relationship between the excluded (j-th) symbol $S_j$ and the i-th read symbol $S_i$ in the V2C matrix (as better discussed here below).

According to an embodiment, for each j-th excluded symbol, the respective offset LLR value $LLR_{OFFSET2(i,j)}$, $LLR_{OFFSET3(i,j)}$ depends on a difference between the distance relationship between the i-th read symbol $S_i$ and the j-th excluded symbol $S_j$ and the distance relationship between the i-th read symbol $S_i$ and a less probable candidate symbol (i.e., the candidate symbol associated with the h-LLR value, among the h-LLR values associated with the N candidate symbols associated with the i-th read symbol $S_i$, indicative of the lowest symbol probability, i.e. the h-LLR value $LLR^*_{i,j}$).

Considering the binary distance as an example of distance relationship, the offset LLR value for both the V_SUM matrix and the V2C matrix may be determined as follows (omitting, for simplicity, the indication of the indices i,j and of the decoding matrix):

$$LLR_{SET}[w(\text{read\_sym xor our\_sym})] - LLR_{SET}[w(\text{read\_sym xor last\_sym})]$$

wherein:
read_sym denotes the read symbol;
last_sym denotes the less probable candidate symbol;
our_sym denotes the excluded symbol for which the offset LLR value has to be computed;
w(x) denotes the sum of 1 in the binary representation of argument x;
[w(read_sym xor our_sym)] represents the binary distance between the read symbol and the excluded symbol, and
[w(read_sym xor last_sym)] represents the binary distance between the read symbol and the less probable candidate symbol.

Just as a first numerical example, considering the LLR value set $LLR_{SET}$ obtained for BER=0.0104 assuming an AWGN channel model:

$$LLR_{SET} = \{0, 46, 91, 137, 182, 228, 273, 319, 364\}$$

and assuming:
read_sym=1
last_sym=0,
our_sym=255
the following offset LLR value would be obtained:

$$LLR_{SET}[w(1 \text{xor} 255)] - LLR_{SET}[w(1 \text{xor} 0)] = 273$$

Just as a second numerical example, considering the LLR value set $LLR_{SET}$ obtained for BER=0.0104 assuming an AWGN channel model:

$$LLR_{SET} = \{0, 46, 91, 137, 182, 228, 273, 319, 364\}$$

and assuming:
read_sym=1
last_sym=0,
our_sym=10
the following offset LLR value would be obtained:

$$LLR_{SET}[w(1 \text{xor} 10)] - LLR_{SET}[w(1 \text{xor} 0)] = 91$$

According to an embodiment, the method 400 comprises determining, for the V_SUM matrix, an approximated LLR value for each j-th excluded symbol $S_j$ associated with the i-th read symbol $S_i$ (action node 430).

Thus, from this phase on (and until subsequent reduction performed at action nodes 440-445), the reduced size V_SUM matrix is temporarily re-enlarged to take into account the excluded symbols initially excluded from the V_SUM matrix. This temporarily re-enlarged V_SUM matrix (hereinafter referred to as temporary V_SUM matrix) is a matrix including $2^r$ elements for each read symbol (as the initial LLR table), wherein, for each read symbol, each element (i,j) of the temporary V_SUM matrix is filled with the respective h-LLR value $LLR_{i,j}$ (if provided in the V_SUM matrix) or with a respective approximated LLR value.

According to an embodiment, the approximated LLR value for the element (i,j) of the temporary V_SUM matrix is based on the h-LLR value associated with the less probable candidate symbol (i.e., the h-LLR value $LLR^*_{i,j}$), and on the offset LLR value indicative of the distance relationship between the j-th excluded symbol $S_j$ and the i-th read symbol $S_i$. Therefore, in this embodiment, the approximated LLR value for the element (i,j) of the temporary V_SUM matrix corresponds to the LLR value estimate $LLR_{EST2(i,j)}$ discussed above.

According to an embodiment, the method 400 comprises updating the h-LLR values $LLR_{i,j}$ and the approximated LLR values $LLR_{EST2(i,j)}$ of the (temporary) V_SUM matrix with the respective LLR updating values $\delta_{LLRi,j}$, thereby obtaining respective updated LLR values (action node 435).

According to an embodiment, the method 400 comprises, based on the updated LLR values, associating (action node 440), with each i-th read symbol $S_i$ of the $2^r$ read symbols, a plurality of mutually-different candidate symbols, wherein the plurality of candidate symbols comprises, for the i-th read symbol $S_i$, a predetermined number N of the $2^r$ possible symbols for which the updated LLR values associated with the i-th read symbol $S_i$ are indicative of the highest symbol probabilities. Thus, action node 440 essentially performs same operations discussed in connection with action node 405.

Similarly to the above, according to an embodiment, the plurality of candidate symbols associated with the i-th read symbol $S_i$ comprise a predetermined number N of the possible symbols that are the closest, in terms of a distance relationship, to the i-th read symbol.

Similarly to the above, according to an embodiment, the distance relationship may depend on the channel model. Just as an example, in case of AWGN channel model, the distance relationship may be a binary distance.

According to an embodiment, the method 400 comprises storing the (updated) plurality of candidate symbols and the updated LLR values associated therewith, the (updated) excluded symbols being excluded from storing (action node 445), thus obtaining an updated, reduced size V_SUM matrix.

According to an embodiment, the method 400 comprises performing action nodes 430-445 for the V2C matrix. This is conceptually represented in the figure by loop connection between action node 445 and decision node L.

Operations performed at action nodes 430-445 for V_SUM matrix update equivalently apply for V2C matrix update, as summarized here below.

According to an embodiment, the method 400 comprises determining, for the V2C matrix, an approximated LLR value for each j-th excluded symbol $S_j$ associated with the i-th read symbol $S_i$ (action node 430).

Thus, from this phase on (and until subsequent reduction performed at action nodes 440-445), the reduced size V2C matrix is temporarily re-enlarged to take into account the excluded symbols initially excluded from the V2C matrix. This temporarily re-enlarged V2C matrix (hereinafter referred to as temporary V2C matrix) is a matrix including $2^r$ elements for each read symbol (as the initial LLR table), wherein, for each read symbol, each element (i,j) of the temporary V2C matrix is filled with the respective h-LLR value $LLR_{i,j}$ (if provided in the V2C matrix) or with a respective approximated LLR value.

According to an embodiment, the approximated LLR value for the element (i,j) of the temporary V2C matrix is based on the h-LLR value associated with the less probable candidate symbol (i.e., the h-LLR value $LLR^*_{i,j}$), and on the offset LLR value indicative of the distance relationship between the j-th excluded symbol $S_j$ and the i-th read symbol $S_i$. Therefore, in this embodiment, the approximated LLR value for the element (i,j) of the temporary V2C matrix corresponds to the LLR value estimate $LLR_{EST3(i,j)}$ discussed above.

According to an embodiment, the method 400 comprises updating the h-LLR values $LLR_{i,j}$ and the approximated LLR values $LLR_{EST3(i,j)}$ of the (temporary) V2C matrix with the respective LLR updating values $\delta_{LLRi,j}$, thereby obtaining respective updated LLR values (action node 435).

According to an embodiment, the method 400 comprises, based on the updated LLR values, associating (action node 440), with each i-th read symbol $S_i$ of the $2^r$ read symbols, a plurality of mutually-different candidate symbols, wherein the plurality of candidate symbols comprises, for the i-th read symbol $S_i$, a predetermined number N of the $2^r$ possible symbols for which the updated LLR values associated with the i-th read symbol $S_i$ are indicative of the highest symbol probabilities.

Similarly to the above, according to an embodiment, the plurality of candidate symbols associated with the i-th read symbol $S_i$ comprise a predetermined number N of the possible symbols that are the closest, in terms of a distance relationship depending on the channel model (for example, a binary distance), to the i-th read symbol $S_i$.

According to an embodiment, the method 400 comprises storing the (updated) plurality of candidate symbols and the updated LLR values associated therewith, the (updated) excluded symbols being excluded from storing (action node 445), thus obtaining an updated, reduced size V2C matrix.

According to an embodiment, as mentioned above, the method 400 comprises performing a decoding attempt based on the updated V_SUM matrix (action node 450). According to an embodiment, the decoding attempt is based on syndrome calculation. According an embodiment, a successful decoding (positive outcome of the decoding attempt) is determined if the calculated syndrome gives rise to an all-zero vector, in which case the vector of decoding attempts forms the output codeword.

According to an embodiment, the method 400 comprises reiterating nodes 420-450 depending on an outcome of the decoding attempt.

According to an embodiment, at each current l-th iteration, in case of negative outcome of the decoding attempt (exit branch N of decision node 455), nodes 420-450 are reiterated for a subsequent (l+1)-th iteration following the current iteration.

According to an embodiment, at each current l-th iteration, in case of positive outcome of the decoding attempt (exit branch Y of decision node 455), the decoding procedure ends.

According to an embodiment, nodes 420-450 are reiterated for a subsequent (l+1)-th iteration following the l-th current iteration in case of negative outcome of the decoding attempt (exit branch N of decision node 455) and until a maximum number of decoding iterations $l_{max}$ is reached (see decision node 460). According to an embodiment, the maximum number $l_{max}$ of decoding iterations comprises a number of decoding iterations that are admitted to be performed in order to meet predefined requirements (such as a latency of the SSD device).

According to an embodiment, if, exit branch N of decision node 460, the l-th decoding iteration is not below the maximum number $l_{max}$ of decoding iterations, an unsuccessful decoding is determined and the decoding procedure ends; otherwise, exit branch Y of decision node 460, nodes 420-460 are repeated as such during the following decoding iteration (i.e., the (l+1)-th decoding iteration).

Thanks to the present disclosure, a reduced size non-binary LDPC decoder may be obtained. The present disclosure is particularly useful when large finite fields are considered, since it allows exploiting symbol decoding strength while saving a lot of space, essentially without performance losses.

Naturally, in order to satisfy local and specific requirements, a person skilled in the art may apply many logical and/or physical modifications and alterations to the present disclosure. More specifically, although the present disclosure has been described with a certain degree of particularity with reference to one or more embodiments thereof, it should be understood that various omissions, substitutions and changes in the form and details as well as other embodiments are possible. Particularly, different embodiments of the present disclosure may be practiced even without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). Furthermore, ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

Generally, similar considerations apply if the present disclosure is implemented with equivalent methods (by using similar steps with the same functions of more steps or portions thereof, removing some non-essential steps or adding further optional steps); moreover, the steps may be performed in a different order, concurrently or in an interleaved way (at least in part).

Moreover, similar considerations apply if the SSD controller (or, more generally, the SSD device) has a different structure, comprises equivalent components or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

What is claimed is:

1. A method for decoding, in a solid-state storage device, a read symbol encoded with a Q-ary LDPC (Low-Density-Parity-Check) code defined over a binary-extension Galois field $GF(2^r)$ and identified by a parity-check matrix associated with check nodes and variable nodes of a Tanner graph representing the parity-check matrix, wherein the read symbol is associated with $2^r$ LLR(Log Likelihood Ratio) values each one denoting a symbol probability indicative that the read symbol was equal to a respective one among $2^r$ possible symbols before being corrupted by channel noise effects, and wherein said decoding is based on a processing of a first matrix and a second matrix indicative of messages from check nodes to variable nodes and from variable nodes to check nodes, respectively, exchanged by means of a message passing computation rule, and of a third matrix providing a decoding attempt for the read symbol, the method comprising: (a) associating, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols; (b) storing said plurality of candidate symbols and the LLR values associated therewith in the second matrix and in the third matrix, the excluded symbols being excluded from storing; (c) based on said second matrix, performing a check node update procedure to update the first matrix; (d) performing a variable node update procedure by: (d1) determining an updating LLR value for each of the possible symbols associated with the read symbol, wherein said determining is based on the first, second and third matrices; (d2) determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol; (d3) updating the LLR values and the approximated LLR values of the third matrix with the respective LLR updating values, thereby obtaining respective updated LLR values; (d4) performing step (a) based on the updated LLR values; (d5) performing steps (d2), (d3) and (d4) for the second matrix; (d6) performing step (b) for both the second matrix and the third matrix based on the respective plurality of candidate symbols and the updated LLR values associated therewith, thereby obtaining an updated second matrix and an updated third matrix; (e) determining an outcome of the decoding attempt provided by the updated third matrix, and iterating steps (c) to (e) in case of a negative outcome of the decoding attempt.

2. The method of claim 1, wherein, at each current iteration, said updating LLR value is indicative of a LLR value difference arising from check node update procedure performed at the current iteration, and the variable node update procedure performed at a previous iteration preceding the current iteration.

3. The method of claim 1, wherein said determining an updating LLR value for each of the possible symbols associated with the read symbol is based, for each possible symbol, and for each of the first, second and third matrices, on the corresponding LLR value associated with the possible symbol if the respective possible symbol is a candidate symbol for the read symbol, or on a corresponding estimate of the LLR value associated with the possible symbol if the possible symbol is a respective excluded symbol for the read symbol.

4. The method of claim 3, wherein said estimate of the LLR value is based, for the read symbol, on the LLR value, among the respective LLR values associated with the plurality of candidate symbols, indicative of the lowest symbol probability, and on a respective correction factor.

5. The method of claim 4, wherein the correction factor comprises a positive constant depending on the distance relationship between the read symbol and the excluded symbol.

6. The method of claim 4, wherein the correction factor comprises said offset LLR value.

7. The method of claim 1, wherein, for each excluded symbol, the respective offset LLR value depends on a difference between the distance relationship between the read symbol and the excluded symbol and the distance relationship between the read symbol and the candidate symbol associated with the LLR value, among the LLR values associated with the plurality of candidate symbols associated with the read symbol, indicative of the lowest symbol probability.

8. The method of claim 1, wherein said plurality of candidate symbols associated with the read symbol comprise a predetermined number of the possible symbols that are the closest, in terms of said distance relationship, to the read symbol.

9. The method of claim 1, wherein the distance relationship depends on channel model.

10. The method of claim 9, wherein the channel model is an "Additive White Gaussian Noise" (AWGN) channel model.

11. The method of claim 1, wherein the distance relationship is a binary distance.

12. The method of claim 1, wherein said determining an outcome of the decoding attempt is based on syndrome calculation.

13. The method of claim 1, wherein said iterating steps (c) to (e) is performed until a maximum number of decoding iterations is reached.

14. The method of claim 1, wherein the message passing computation rule comprises a "Belief Propagation" (BP) algorithm, a "Min-Sum" algorithm or an "Extended Min-Sum" algorithm.

15. A controller for a solid-state storage device, wherein the controller is configured to decode a read symbol encoded with a Q-ary LDPC Low-Density-Parity-Check) code defined over a binary-extension Galois field $GF(2^r)$ and identified by a parity-check matrix associated with check nodes and variable nodes of a Tanner graph representing the parity-check matrix, wherein the read symbol is associated with $2^r$ LLR(Log Likelihood Ratio) values each one denoting a symbol probability indicative that the read symbol was equal to a respective one among $2^r$ possible symbols before being corrupted by channel noise effects, and wherein the controller is configured to decode the read symbol based on a processing of a first matrix and a second matrix indicative of messages from check nodes to variable nodes and from variable nodes to check nodes, respectively, exchanged by means of a message passing computation rule, and of a third matrix providing a decoding attempt for the read symbol, the controller being configured to decode the read symbol by performing the following steps: (a) associating, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols; (b) storing said plurality of candidate symbols and the LLR values associated therewith in the second matrix and in the third matrix, the excluded symbols being excluded from storing; (c) based on said second matrix, performing a check node update procedure to update the first matrix; (d) performing a variable node update procedure by: (d1) determining an updating LLR value for each of the possible symbols associated with the read symbol, wherein said determining is based on the first, second and third matrices; (d2) determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol; (d3) updating the LLR values and the approximated LLR values of the third matrix with the respective LLR updating values, thereby obtaining respective updated LLR values; (d4) performing step (a) based on the updated LLR values; (d5) performing steps (d2), (d3) and (d4) for the second matrix; (d6) performing step (b) for both the second matrix and the third matrix based on the respective plurality of candidate symbols and the updated LLR values associated therewith, thereby obtaining an updated second matrix and an updated third matrix; (e) determining an outcome of the decoding attempt provided by the updated third matrix, and iterating steps (c) to (e) in case of a negative outcome of the decoding attempt.

16. A solid-state storage device comprising memory cells and a controller, wherein the controller is configured to decode a read symbol encoded with a Q-ary LDPC Low-Density-Parity-Check) code defined over a binary-extension Galois field $GF(2^r)$ and identified by a parity-check matrix associated with check nodes and variable nodes of a Tanner graph representing the parity-check matrix, wherein the read symbol is associated with $2^r$ LLR(Log Likelihood Ratio) values each one denoting a symbol probability indicative that the read symbol was equal to a respective one among $2^r$ possible symbols before being corrupted by channel noise effects, and wherein the controller is configured to decode the read symbol based on a processing of a first matrix and a second matrix indicative of messages from check nodes to variable nodes and from variable nodes to check nodes, respectively, exchanged by means of a message passing computation rule, and of a third matrix providing a decoding attempt for the read symbol, the controller being configured to decode the read symbol by performing the following steps: (a) associating, with the read symbol, a plurality of mutually-different candidate symbols, wherein said plurality of candidate symbols comprise a predetermined number of the possible symbols for which the LLR values associated with the read symbol are indicative of highest symbol probabilities, the possible symbols other than the plurality of candidate symbols identifying excluded symbols; (b) storing said plurality of candidate symbols and the LLR values associated therewith in the second matrix and in the third matrix, the excluded symbols being excluded from storing; (c) based on said second matrix, performing a check node update procedure to update the first matrix; (d) performing a variable node update procedure by: (d1) determining an updating LLR value for each of the possible symbols associated with the read symbol, wherein said determining is based on the first, second and third matrices; (d2) determining, for the third matrix, an approximated LLR value for each excluded symbol associated with the read symbol, wherein said determining is based (i) on the LLR value, among the LLR values associated with the plurality of candidate symbols associated with the read symbol, indicative of the lowest symbol probability, and (ii) on an offset LLR value indicative of a distance relationship between the excluded symbol and the read symbol; (d3) updating the LLR values and the approximated LLR values of the third matrix with the respective LLR updating values, thereby obtaining respective updated LLR values; (d4) performing step (a) based on the updated LLR values; (d5) performing steps (d2), (d3) and (d4) for the second matrix; (d6) performing step (b) for both the second matrix and the third matrix based on the respective plurality of candidate symbols and the updated LLR values associated therewith, thereby obtaining an updated second matrix and an updated third matrix; (e) determining an outcome of the decoding attempt provided by the updated third matrix, and iterating steps (c) to (e) in case of a negative outcome of the decoding attempt.

* * * * *